United States Patent [19]
Nomura et al.

[11] Patent Number: 5,980,975
[45] Date of Patent: *Nov. 9, 1999

[54] THIN-FILM-COATED SUBSTRATE MANUFACTURING METHODS HAVING IMPROVED FILM FORMATION MONITORING AND MANUFACTURING APPARATUS

[75] Inventors: Fumiyasu Nomura; Takeshi Saito, both of Otsu, Japan

[73] Assignee: Toray Industries, Inc., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/596,106

[22] PCT Filed: May 31, 1995

[86] PCT No.: PCT/JP95/01048

§ 371 Date: Apr. 19, 1996

§ 102(e) Date: Apr. 19, 1996

[87] PCT Pub. No.: WO95/33081

PCT Pub. Date: Dec. 7, 1995

[30] Foreign Application Priority Data

May 31, 1994 [JP] Japan ................................. 6/118704
Jul. 11, 1994 [JP] Japan ................................. 6/158790

[51] Int. Cl.⁶ .......................... B05D 3/00; C23C 14/00; C23C 16/00; B05C 11/00
[52] U.S. Cl. .............................. 427/10; 427/8; 427/523; 427/566; 427/561; 204/192.13; 204/298.03; 118/718; 118/720; 118/723 VE; 118/691
[58] Field of Search ........................... 427/10, 8, 9, 523, 427/566, 561, 567; 204/192.13, 298.03; 118/718, 720, 723 VE, 723 EB, 729, 688, 690, 691

[56] References Cited

U.S. PATENT DOCUMENTS 3,411,852 11/1968 Marinozzi, Jr. .
3,645,771 2/1972 Ward ............................................ 427/10
3,799,800 3/1974 Thelen et al. .............................. 427/10
3,892,490 7/1975 Uetsuki et al. ........................... 427/10

(List continued on next page.)

FOREIGN PATENT DOCUMENTS

0570618A1  11/1993  European Pat. Off. .
1306560    12/1989  Japan .
4041671A   2/1992   Japan .

OTHER PUBLICATIONS

Lerner et al, *Encyclopedia of Physics*, 2$^{nd}$ Ed., VCH Publishers, Inc. New York, 1991 (no month), excerpts from pp. 1, 546–548, 1041–1046.

*Webster's Ninth New Collegiate Dictionary*, 1983 (no month), Merian–Webster Inc., excerpts pp. 613, 989–990.

Abstract of 61–280,027A, application date Jun. 6, 1985, publication date Oct. 12, 1986 to Suzuki Kenji; Abstracts of Japan.

*Primary Examiner*—Marianne Padgett
*Attorney, Agent, or Firm*—Birch, Stewart, Kolasch & Birch, LLP

[57] ABSTRACT

The present invention is directed to providing thin-film-coated substrate manufacturing methods and apparatus that make it possible to manufacture large thin-film-coated substrates such as anti-reflection filters using relatively small production facilities. The thin-film-coated substrate manufacturing methods pertaining to the present invention area capable of producing thin films on substrates to be coated as large as the film formation area by using a film formation monitor or monitors placed outside of the film formation area or displaceably mobile therein, measuring the thickness of the monitor thin film or films formed on the film formation monitor or monitors, and controlling the film coating process based on the measured thickness of the monitor thin film or films. It is also capable of increasing the productivity of the manufacturing process through increased flexibility in the arrangement of substrate or substrates to be coated inside the film formation area.

29 Claims, 18 Drawing Sheets

U.S. PATENT DOCUMENTS

| | | | |
|---|---|---|---|
| 3,984,581 | 10/1976 | Dobler et al. | 427/10 |
| 4,331,702 | 5/1982 | Hieber et al. | 427/10 |
| 4,427,711 | 1/1984 | Martin | 427/10 |
| 4,837,044 | 6/1989 | Murarka et al. | 427/10 |
| 4,878,755 | 11/1989 | Siegmund et al. | 427/10 |
| 5,024,853 | 6/1991 | Landreau et al. | 427/10 |
| 5,190,590 | 3/1993 | Suzuki et al. | 427/10 |
| 5,262,194 | 11/1993 | Bischer, Jr. et al. | 427/10 |
| 5,354,575 | 10/1994 | Dagenais et al. | 427/10 |
| 5,372,837 | 12/1994 | Shimoyama et al. | 427/10 |
| 5,414,506 | 5/1995 | Saisho et al. | 356/128 |

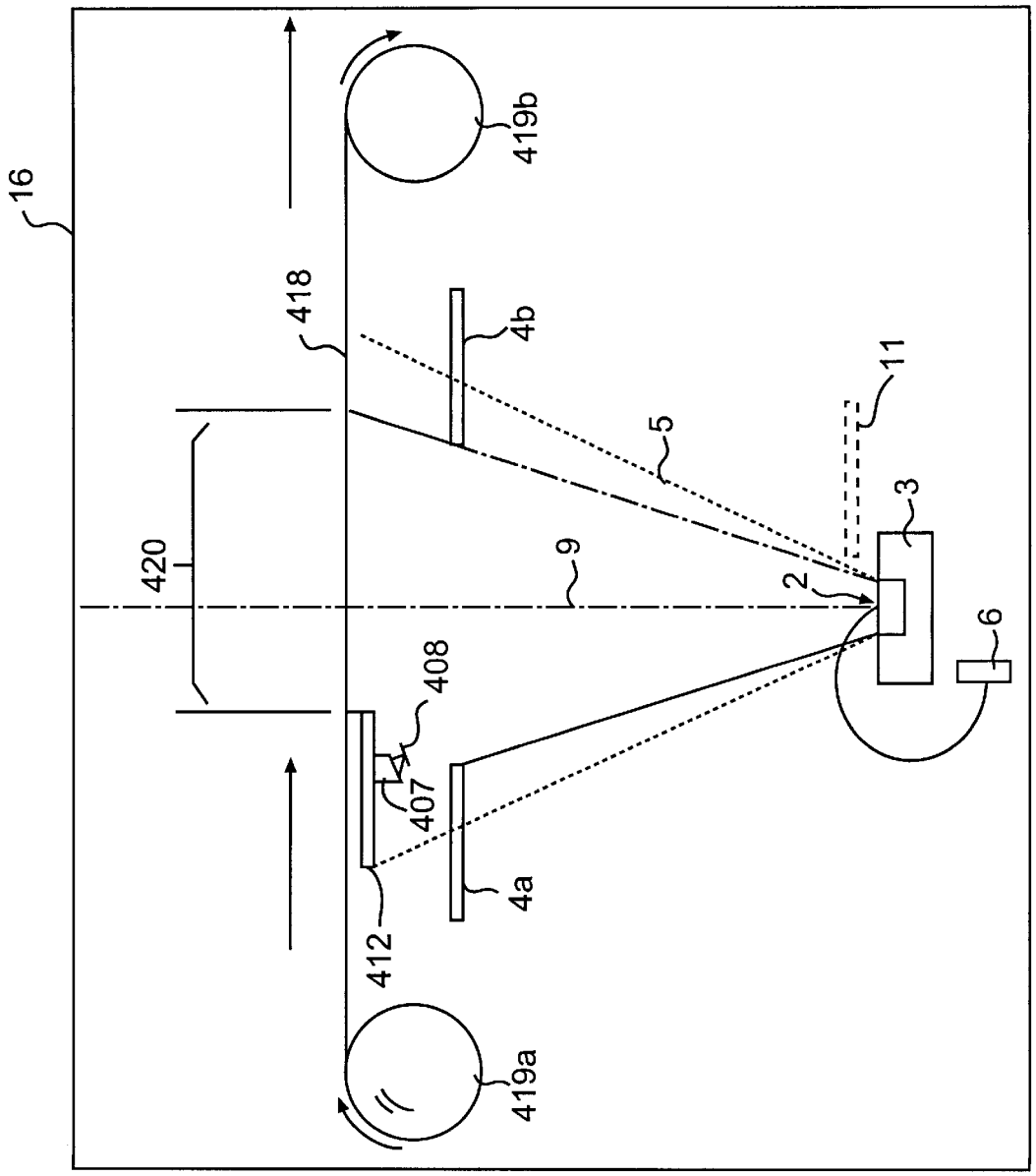

THIN-FILM-COATED SUBSTRATE MANUFACTURING METHODS HAVING IMPROVED FILM FORMATION MONITORING AND MANUFACTURING APPARATUS

TECHNICAL FIELD

This invention relates to manufacturing methods and apparatus for thin-film-coated substrates involving optical coatings for optical filters, such as anti-reflection filters, interference filters, half mirrors and band-pass filters; anti-reflection coatings for various display devices; and other thin film products used for semiconductors, optical disks, etc.

BACKGROUND ART

There are two conventional methods of manufacturing optical filters and other thin-film-coated substrates based on techniques such as vacuum evaporation and sputtering. One comprises the measurement of the thickness of the thin film produced and control of the film coating process based on the results of such measurement, while the other provides no such control, and both are widely used.

The method that does not incorporate thin film thickness measurement aims to achieve the desired thickness by, for example, controlling the film formation time while keeping the conditions of the film formation atmosphere and speed constant. In the case of producing a thin film while moving the substrates to be coated, the desired film thickness may be obtained by controlling their moving speed.

With such a thin-film-coated substrate manufacturing method, it is not possible to check whether the thin film being produced would satisfy the required specification until the film coating process is completed, as the film thickness is not measured during the process. A thin film production apparatus normally operates in a vacuum so that it is not desirable to frequently take out the substrate on which a thin film is being produced to measure its thickness. Therefore, where more than one thin film is generated, measurement is not carried out until the production of all thin films is complete.

However, operating conditions of thin film production apparatus, such as film formation speed, are generally susceptible to fluctuations, and these have quite frequently caused the film thickness to fluctuate, resulting in the production of coatings that do not meet the specifications. Therefore, with thin film production methods in which film thickness measurement was not used, it was difficult to sustain the yield above a certain level.

As a result, the control of the film coating process through the measurement of film thickness began to be practiced. Taking the production of anti-reflection coatings and other optical coatings over plane substrates, such as glass plates, as an example, conventional methods of manufacturing thin-film-coated substrates in which the film thickness is measured and the film coating process is controlled based on the results of such measurements are explained with reference to the accompanying drawings.

FIG. 7 is a schematic diagram which shows the thin-film-coated substrate manufacturing process as viewed in a direction parallel to the substrate surface and perpendicular to the direction of the movement of the substrates. Inside a vacuum vessel 16, a thin film material 3 is placed, with the film-forming particle flux generating element 2 pointing upwards in the diagram. Electrons are ejected from an electron gun 6, and travel to the film-forming particle flux generating element 2 due to the effect of a magnetic field, not shown on the diagram. On collision with the element, they heat it, thereby generating a film-forming particle flux 5. The film-forming particle flux axis 9, i.e. the axis of the film-forming particle flux 5 (representing the direction in which film-forming particles are generated in the highest density), points upwards in the diagram. A film formation monitoring plate 8 is placed on the film-forming particle flux axis 9 or in its vicinity, and a film thickness measuring device 7, which optically measures the thickness of the thin film formed on the film formation monitoring plate 8, is located above it. An arrangement is made so that a thin film is formed on the underside of each of the group of substrates to be coated 1 through exposure to the film-forming particle flux 5 in the vicinity of the film-forming particle flux axis 9, as they move along a path set between the film-forming particle flux generating element 2 and the film formation monitoring plate 8 in a direction perpendicular to the film-forming particle flux axis 9 (from left to right on the diagram). Also, to limit the range of the group of substrates to be coated 1 exposed to the film-forming particle flux 5 along their movement path, corrector plates 4 are placed between the film-forming particle flux generating element 2 and the group of substrates to be coated 1. A shutter 11 that shuts off the film-forming particle flux 5 as necessary is also provided.

FIG. 8 views this set-up from the location of the film-forming particle beam generating element 2 along the film-forming particle beam axis 9. The group of substrates to be coated 1 is arranged in, for example, two columns as shown in the diagram, ensuring that a gap is created so that the film-forming particle beam 5 is not blocked along the film-forming particle beam axis 9 and in its vicinity. The film formation monitoring plate 8 is placed in such a way that film-forming particles reach it through this gap.

When producing a thin film on each of the group of substrates to be coated 1, the film-forming particle beam generating element 2 of the thin film material 3 is continuously heated with the electron beam generated by the electron gun 6, causing it to emit film-forming particles. Initially, the shutter 11 is closed, and film-forming particles cannot reach the substrates to be coated. When the temperature of the film-forming particle beam generating element 2 reaches a steady state, the rate of film-forming particle generation also reaches a steady state. Upon confirming this, the shutter 11 is opened and at the same time the group of substrates to be coated 1 is made to move at a constant speed from left to right on FIG. 7. The film-forming particles generated by the film-forming particle beam generating element 2 travel along the film-forming particle beam axis 9, spreading outwards as the traveling distance increases, and reach the group of substrates to be coated 1. Of the space occupied by film-forming particles, the region in which film-forming particles are in sufficiently high concentration is defined as the film-forming particle beam 5. Some film-forming particles, traveling along the film-forming particle beam axis 9 or in its vicinity, reach the film formation monitoring plate 8 through the gap created between substrates.

The thickness of the thin film on each of the group of substrates to be coated 1 is measured indirectly by measuring the thickness of the monitor thin film formed on the film formation monitoring plate 8 using the film thickness measuring device 7. The formation of a thin film on the film formation monitoring plate 8 occurs under similar conditions to those for each substrate in the group of substrates to be coated 1. Therefore, the thickness of the monitor thin film has a certain relationship with that of the thin film formed on each substrate in the group of substrates to be coated 1. Ideally, when thin films are formed on 10 groups of substrates to be coated 1, the thickness of the monitor thin film formed on the film formation monitoring plate 8 becomes approximately 10 times that of the thin film formed on one group of substrates to be coated 1. In practice, such a correspondence is accurately determined through experiments. From this result, the correspondence between the time rate of change in the thickness of the monitor thin film formed on the film formation monitoring plate 8 and the time rate of change in the thin film formed on the groups of substrates to be coated 1 can also be obtained.

Based on these thin film thickness measurement results, the film coating process is controlled, involving, for example, the adjustment of the film formation speed or physical properties of the thin film, such as refractive index, and the closing of the shutter 11 as soon as the desired film thickness is obtained.

Methods of controlling the film coating process through the measurement of the thickness of a thin film obtained along the film-forming particle beam axis or in its vicinity through the use of a film formation monitor as shown above have been disclosed, for example, in JP-A-01-306560.

However, the inventors of the present invention discovered that such conventional thin-film-coated substrate manufacturing methods had problems as shown below.

Namely, to have a monitor thin film formed on the film formation monitor by placing it on the film-forming particle beam axis or in its vicinity for the purpose of thin film thickness measurement, it was necessary to arrange or move the substrates to be coated so as to prevent them from blocking film-forming particles and create a gap around the center of the film-forming particle beam. Nevertheless, this hardly became an issue, as far as small substrates to be coated, such as optical lenses, were involved, as they were placed in a large number of columns.

However, the inventors of the present invention found that placing a film formation monitor on the film-forming particle beam axis or in its vicinity for thin film thickness measurement led to an undesirable over-sizing of the production facility or a sharp fall in productivity, when producing a thin film on a large substrate such as the surface anti-reflection filter of a display device with a diagonal size of 14 in. (35 cm) or more. Namely, to prevent substrates to be coated from blocking the film-forming particles around the center of the film-forming particle beam, the group of substrates to be coated 1 had to be arranged in at least two columns as shown in FIG. 8 to ensure that a gap was always created between substrates to be coated. Therefore, the area in which the group of substrates to be coated 1 were exposed to the film-forming particle beam 5 (film formation area 20 as shown with a two-dot chain line in FIG. 8) needed to be more than twice the width of the substrate to be coated.

Furthermore, when fixed film formation monitors were placed in the vicinity of the film-forming particle beam axis, it was sometimes impossible to control the film coating process by means of a film formation monitor, as the substrates to be coated or their supports came in the way, lying between the film formation monitor and film-forming particle beam generating element, as the dimensions of the substrate to be coated changed due to a change in the type of substrate to be coated to be manufactured. In other words, controlling a film coating process using fixed film formation monitors required severe restrictions to be placed on the dimensions or shapes of substrates to be coated.

Moreover, as far as the inventors of the present invention know, there are cases where the thickness of the monitor thin film formed on the film formation monitor becomes far thinner than that of the thin film formed on the film formation monitor, if a fairly large gap between substrate columns is not secured. The inventors of the present invention have discovered that this is mainly due to the fact that some of the traveling film-forming particles become deflected due to collision with the remaining gas molecules in the vacuum vessel and caught by the substrates to be coated or substrate holders that support them. FIG. 9 shows this mechanism. If there were no gas molecules inside the vacuum vessel, such film-forming particles would travel from the film-forming particle beam generating element to the film formation monitor through the gap between substrate columns without any interference. In such a case, therefore, the thickness of the monitor thin film formed on the film formation monitor would become almost the same as that of the thin film formed on substrates to be coated. In reality, however, some gas molecules always remain in the vacuum vessel due to a limitation in the performance of the vacuum pump or the necessity of the film coating process. As a result, film-forming particles reach the substrates to be coated or film formation monitor after colliding with these gas molecules. Since there is no obstacle between the film-forming particle beam generating element and substrates to be coated, those film-forming particles having collided with gas molecules can still reach substrates to be coated, although their traveling paths are zigzagged. In the case of the film formation monitor, however, the film-forming particles having collided with gas molecules become blocked by substrates to be coated etc., unless the gap between substrate columns is made quite large, as the substrates to be coated are placed before it with respect to the film-forming particle beam generating element. Also, the distance from the film-forming particle beam generating element is generally greater for the film formation monitor than substrates to be coated, when it is placed in the vicinity of the film-forming particle beam axis. Therefore, an increasing proportion of the film-forming particles fail to reach the film formation monitor due to collision with gas molecules though they are roughly in the direction towards the film formation monitor. As a result, the thickness of the thin film formed on the film formation monitor becomes, for example, less than half that of the thin film formed on the substrates to be coated. Therefore, it was necessary that the width of the film formation area be set considerably greater than twice the width of the substrate to be coated.

For example, to form a thin film on the surface anti-reflection filter (shorter side 31 cm×longer side 38 cm) of a display device with a diagonal size of 17 in. (43 cm), the width of the film formation area was required to be considerably greater than 62 cm, which was twice the length of the shorter side, (e.g. 70 cm or more). The seriousness of this problem increases as the size of the substrate to be coated increases.

Even when the width of the film formation area is quite large, severe restrictions are unavoidably placed on the dimensions or arrangement of substrates to be coated that form a substrate group (e.g. whether to set the moving direction of the substrates along its longer side or perpendicular to it), to ensure that a gap is created in the middle of the film formation area. Therefore, even where there was no obstacle to obtaining a wide film formation area from the production facility point of view, in many cases it was not possible to take full advantage of it due to restrictions in terms of sizes and arrangements of substrates to be coated, leading to a severe loss in productivity. For example, when a thin film is produced on the surface anti-reflection filter (shorter side 31 cm) of a display device with a diagonal size of 17 in. (43 cm) using a production facility with a 1 m-wide film formation area, it is physically possible to place such substrates to be coated in three columns. Nevertheless, it was necessary to limit the number of columns to two due to the need to arrange the substrates to be coated in such a way that they would not block the film formation monitor placed in the vicinity of the film-forming particle beam axis (i.e. around the center of the film formation area). Namely, it was only possible to manufacture the above type of filters at ⅔ of the potential productivity.

Also, since it is common to produce various types of thin-film-coated substrates using the same production facility, placing the film formation monitor on the basis of a particular type of substrate to be coated and its specific arrangement pattern unavoidably gives rise to the same productivity problem as the one above, when making other types of products.

Moreover, when the substrate to be coated is a tape-like material made of a plastic etc., thin film production is sometimes carried out continuously, as the substrate to be coated is unwound from the substrate roll. In such cases, it was necessary to, for example, limit the width of each of the parallel tape-like substrates to less than ½ that of the film formation area and unwind it after winding it onto a pair of substrate rolls. In such cases, an undesirable over-sizing of the production facility or reduction in productivity due to constraints on the width of the tape-like substrate was unavoidable for the same reason.

The following seem to be the reasons why thin film thickness measurement is carried out by placing a film formation monitor on the film-forming particle beam axis or in its vicinity, despite the accompanying undesirable increase in the size of the production facility or sharp drop in productivity:

Firstly, the production of a thin film on large substrates to be coated was not undertaken until recently, and problems such as restrictions on the arrangement of the substrates during film production etc., as mentioned above did not come to the fore. Secondly, a thin film formed by film-forming particles traveling along the film-forming particle beam axis or in its vicinity is believed to be most suitable for the monitoring of the film coating process as its characteristics are superior to those of a thin film formed by film-forming particles moving away from the film-forming particle beam axis. This is because film-forming particles traveling along the film-forming particle beam axis or in its vicinity are more numerous and generally have greater kinetic energy, so that they can form homogenous thin films with greater refractive index. In contrast, film-forming particles moving away from the film-forming particle beam axis are relatively few and have lower energy, so that thin films formed of them are low in refractive index and thinner.

Therefore, the placement of the film formation monitor in the vicinity of the film-forming particle beam axis has been treated as a foregone conclusion and other methods have not been considered.

The object of the present invention, therefore, is to offer a thin-film-coated substrate manufacturing method and apparatus that makes it possible to produce multi-type (size) products without the undesirable over-sizing of the production facility or productivity setbacks associated with increases in substrate size and adoption of continuous (tape-like) substrate production.

SUMMARY OF THE INVENTION

The main points of the present invention to solve the above problems are as follows:

First, the case of using a fixed film formation monitor is described.

The thin-film-coated substrate manufacturing method pertaining to the present invention exposes a substrate to be coated, as it is moved, to a film-forming particle beam, measures the thickness of a monitor thin film formed on a film formation monitor placed outside of the area where the substrate to be coated is exposed to the film-forming particle beam, and produces a thin film by controlling the film coating process based on the thickness of the monitor thin film.

Another typical implementation mode of the thin-film-coated substrate manufacturing method pertaining to the present invention exposes a substrate to be coated, as it is moved, to a film-forming particle beam, the exposed area of which is limited by means of a film formation area limiting element, measures the thickness of a monitor thin film formed on a film formation monitor placed on the film-forming particle beam generating source side of the film formation area limiting element, and produces a thin film by controlling the film coating process based on the thickness of the monitor thin film.

Another typical implementation mode of the thin-film-coated substrate manufacturing method pertaining to the present invention exposes a row of substrates to be coated to a film-forming particle beam as they are moved, measures the thickness of a monitor thin film formed on a film formation monitor placed outside of the area where the row of substrates to be coated are exposed to the film-forming particle beam, and produces a thin film by controlling the film coating process based on the thickness of the monitor thin film.

Another typical implementation mode of the thin-film-coated substrate manufacturing method pertaining to the present invention exposes multiple rows of substrates to be coated to a film-forming particle beam as they are moved, measures the thickness of a monitor thin film formed on a film formation monitor placed outside of the area where said multiple rows of substrates to be coated are exposed to the film-forming particle beam, and produces a thin film by controlling the film coating process based on the thickness of the monitor thin film.

Another typical implementation mode of the thin-film-coated substrate manufacturing method pertaining to the present invention exposes a substrate to be coated, as it is moved, to a film-forming particle beam, measures the thickness of a monitor thin film formed on a film formation monitor placed in the outer edge region of the film-forming particle beam which does not obstruct the traveling path of the film-forming particles between the generating source of the film-forming particle beam and the, substrate to be coated, and produces a thin film by controlling the film coating process based on the thickness of the monitor thin film.

A preferred implementation mode of the thin-film-coated substrate manufacturing method pertaining to the present invention is such that the shorter side of the substrate to be coated is 20 cm or more.

Another typical implementation mode of the thin-film-coated substrate manufacturing method pertaining to the present invention exposes a tape-like substrate to be coated to a film-forming particle beam as it is unwound from a substrate roll, measures the thickness of a monitor thin film formed on a film formation monitor placed outside of the area where the substrate to be coated is exposed to the film-forming particle beam, and produces a thin film by controlling the film coating process based on the thickness of the monitor thin film.

A preferred implementation mode of the thin-film-coated substrate manufacturing method pertaining to the present invention is such that the width of the substrate to be coated is 20 cm or more.

A preferred implementation mode of the thin-film-coated substrate manufacturing method pertaining to the present invention is such that the distance from the film formation monitor to the generating source of the film-forming particle beam is 0.9 times or more of the minimum distance and 1.1 times or less of the maximum distance from the generating source to the area where the substrates to be coated are exposed to film-forming particles.

A preferred implementation mode of the thin-film-coated substrate manufacturing method pertaining to the present invention is such that the angle formed by the straight line connecting the location of said film formation monitor and the generating source of the film-forming particle beam and the film-forming particle beam axis is twice or less than the angle formed by the straight line connecting the generating source and the farthest point from it on the area where the substrate to be coated is exposed to the film-forming particle beam and the film-forming particle beam axis.

A preferred implementation mode of the thin-film-coated substrate manufacturing method pertaining to the present invention is such that the angle formed by the straight line connecting the location of the film formation monitor and the generating source of the film-forming particle beam and the normal line to the monitor thin film formation surface on the film formation monitor is 40' or less.

A preferred implementation mode of the thin-film-coated substrate manufacturing method pertaining to the present invention is such that the film coating process is controlled by adjusting the length of the area where the substrates to be coated are exposed to the film-forming particle beam in the direction of their movement.

A preferred implementation mode of the thin-film-coated substrate manufacturing method pertaining to the present invention is such that said film coating process is controlled by adjusting the speed at which the substrates to be coated move within the area where they are exposed to the film-forming particle beam.

A preferred implementation mode of the thin-film-coated substrate manufacturing method pertaining to the present invention is such that the film coating process is controlled by the quantity of film-forming particles that reach the area where the substrates to be coated are exposed to the film-forming particle beam per unit time.

A preferred implementation mode of the thin-film-coated substrate manufacturing method pertaining to the present invention is such that the film coating process is controlled by the surface temperature of the substrates to be coated.

A preferred implementation mode of the thin-film-coated substrate manufacturing method pertaining to the present invention is such that the film coating process is controlled by the film formation speed, which is measured based on the thickness of the monitor thin film.

A preferred implementation mode of the thin-film-coated substrate manufacturing method pertaining to the present invention is such that the film coating process is controlled so as to keep the film formation speed, which is measured based on the thickness of the monitor thin film, constant.

A preferred implementation mode of the thin-film-coated substrate manufacturing method pertaining to the present invention is such that the film coating process consists of vacuum evaporation, ion plating, sputtering or ablation.

A preferred implementation mode of the thin-film-coated substrate manufacturing method pertaining to the present invention is such that the thin-film-coated substrates are surface anti-reflection filters for display devices.

The thin-film-coated substrate manufacturing apparatus pertaining to the present invention incorporates a film-forming particle beam generating source, a means of moving the substrates to be coated that moves them through the area exposed to the film-forming particle beam generated by the film-forming particle beam generating source, and a film formation monitor placed outside of the area where the substrates to be coated are exposed to the film-forming particle beam.

Another typical mode of the thin-film-coated substrate manufacturing apparatus pertaining to the present invention incorporates a film-forming particle beam generating source, a means of moving the groups of substrates to be coated that moves them through the area exposed to the film-forming particle beam generated by the film-forming particle beam generating source, and a film formation monitor placed outside of the area where the groups of substrates to be coated are exposed to the film-forming particle beam.

Another typical mode of the thin-film-coated substrate manufacturing apparatus pertaining to the present invention incorporates a film-forming particle beam generating source, a means of moving a tape-like substrate to be coated that moves it through the area exposed to the film-forming particle beam generated by the film-forming particle beam generating source, and a film formation monitor placed outside of the area where the substrate to be coated is exposed to the film-forming particle beam.

The case of the film formation monitor being mobile is now described.

The thin-film-coated substrate manufacturing method pertaining to the present invention exposes substrates to be coated to a film-forming particle beam while moving them, measures the thickness of the monitor thin film formed on a film formation monitor which is mobile within the area where the substrates to be coated are exposed to the film-forming particle beam, and produces a thin film by controlling the film coating process based on the thickness of the monitor thin film.

Another typical mode of the thin-film-coated substrate manufacturing method pertaining to the present invention exposes substrates to be coated to a film-forming particle beam while moving them, measures the thickness of the monitor thin film formed on a film formation monitor which is mobile within the area where the substrates to be coated are exposed to the film-forming particle beam and at the same time clear of the area where said thin-film-coated substrate is exposed to the beam, and produces a thin film by controlling the film coating process based on the thickness of the monitor thin film.

Another typical mode of the thin-film-coated substrate manufacturing method pertaining to the present invention exposes substrates to be coated arranged in multiple columns to a film-forming particle beam while moving them, measures the thickness of the monitor thin film formed on a film formation monitor which is mobile within the area where the substrates to be coated are exposed to the film-forming particle beam, and produces a thin film by controlling the film coating process based on the thickness of the monitor thin film.

Another typical mode of the thin-film-coated substrate manufacturing method pertaining to the present invention exposes substrates to be coated to a film-forming particle beam while moving them, measures the thickness of the monitor thin film formed on a film formation monitor which is mobile within a region included in the area where the substrates to be coated are exposed to the film-forming particle beam, and produces a thin film by controlling the film coating process based on the thickness of the monitor thin film.

A preferred implementation mode of the thin-film-coated substrate manufacturing method pertaining to the present invention is such that the shorter the of said substrate to be coated is 20 cm or more.

A preferred implementation mode of the thin-film-coated substrate manufacturing method pertaining to the present invention is such that at least a part of the range of the distance from the film formation monitor to the generating source of the film-forming particle beam is 0.9 times or more of the minimum distance and 1.1 times or less of the maximum distance from the generating source to the area where the substrates to be coated are exposed to film-forming particles.

A preferred implementation mode of the thin-film-coated substrate manufacturing method pertaining to the present invention is such that at least a part of the range of the angle formed by the straight line connecting the location of the film formation monitor and the generating source of the film-forming particle beam and the film-forming particle beam axis is twice or less than the angle formed by the straight line connecting the generating source and the farthest point from it on the area where the substrate to be coated is exposed to the film-forming particle beam and the film-forming particle beam axis.

A preferred implementation mode of the thin-film-coated substrate manufacturing method pertaining to the present invention is such that at least a part of the range of the angle formed by the straight line connecting the location of the film formation monitor and the generating source of the film-forming particle beam and the normal line to the monitor thin film formation surface on the film formation monitor is 40' or less.

A preferred implementation mode of the thin-film-coated substrate manufacturing method pertaining to the present invention is such that the film coating process is controlled by the quantity of film-forming particles that reach the area where the substrates to be coated are exposed to the film-forming particle beam per unit time.

A preferred implementation mode of the thin-film-coated substrate manufacturing method pertaining to the present invention is such that the film coating process is controlled by the surface temperature of the substrates to be coated.

A preferred implementation mode of the thin-film-coated substrate manufacturing method pertaining to the present invention is such that the film coating process is controlled by the film formation speed, which is measured based on the thickness of the monitor thin film.

A preferred implementation mode of the thin-film-coated substrate manufacturing method pertaining to the present invention is such that the film coating process is controlled so as to keep the film formation speed constant.

A preferred implementation mode of the thin-film-coated substrate manufacturing method pertaining to the present invention is such that the film coating process consists of vacuum evaporation, ion plating, sputtering or ablation.

A preferred implementation mode of the thin-film-coated substrate manufacturing method pertaining to the present invention is such that the thin-film-coated substrates are surface anti-reflection filters for display devices.

A typical mode of thin-film-coated substrate manufacturing apparatus pertaining to the present invention incorporates a film-forming particle beam generating source, a means of moving substrates to be coated that move them through the area exposed to a film-forming particle beam generated by the film-forming particle beam generating source, and a film formation monitor which is mobile within the area where the substrates to be coated are exposed to the film-forming particle beam.

BRIEF EXPLANATION OF DRAWINGS

FIG. 3 shows the location of the film formation monitor in a third typical implementation of the thin-film-coated substrate manufacturing method pertaining to the present invention.

The elements as shown in the drawings are as follows:

Figure 1:
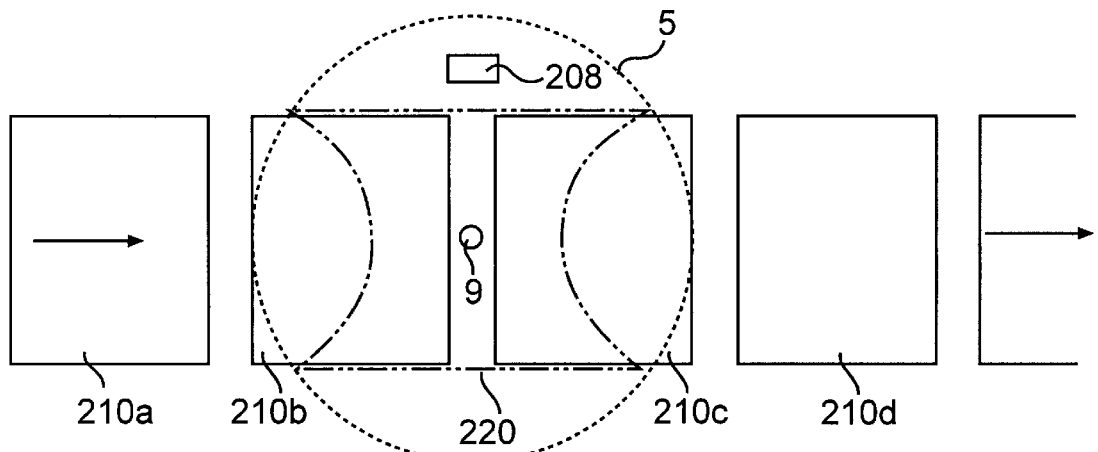
FIG. 1 shows the location of the film formation monitor in a plan view of a first typical implementation of the thin-film-coated substrate manufacturing method pertaining to the present invention.

1: Group of substrates to be coated; 1a: Group of substrates to be coated; 1b: Group of film coating target substrates; 1c: Group of substrates to be coated; 1d: Group of substrates to be coated; 2: Film-forming particle beam generating portion; 3: Raw material for the thin film material; 4a: Corrector plate; 4b: Corrector plate; 5: Film-forming particle beam; 6: Electron gun; 7: Film thickness measuring device; 8: Film formation monitoring plate, 8a–8f: Film formation monitoring plate; 9: Film-forming particle beam axis; 10a: Film coating target substrate; 10a': Film coating target substrate; 10b: Film coating target substrate; 10b': Film coating target substrate; 10c: Film coating target substrate; 10c': Film coating target substrate; 10d: Film coating target substrate; 10d': Film coating target substrate; 11: Shutter; 12: Film-forming particle beam shield; 13: Film-forming particles; 14: Gas molecule; 16: Vacuum vessel; 20: Film formation area; 30: Film-forming particle beam generating source; 31: Spherical surface; 32: Spherical surface; 33: Cone; 34: Outer edge of film formation area; 35: Straight line; 201a: Group of substrates to be coated; 201b: Group of substrates to be coated; 201c: Group of substrates to be coated; 201d: Group of substrates to be coated; 207: Film thickness measuring device; 210a: Film coating target substrate; 210a': Film coating target substrate; 210a": Film coating target substrate; 210b: Film coating target substrate; 210b': Film coating target substrate; 210b": Film coating target substrate; 210c: Film coating target substrate; 210c': Film coating target substrate; 210c": Film coating target substrate; 220: Film formation area; 208: Film formation monitoring plate; 210: Film coating target substrate; 220: Film formation area; 230: Film formation monitor moving mechanism; 307: Film thickness measuring device; 308: Film formation monitoring plate; 310: Film coating target substrate; 320: Film formation area; 407: Film thickness measuring device; 408: Film formation monitoring plate; 412: Film-forming particle beam shield; 418: Film coating target substrate; 419a: Film coating target substrate roll; 419b: Film coating target substrate roll; 508: Film formation monitoring plate; 518: Film coating target substrate; 519a: Film coating target substrate roll; 519b: Film coating target substrate roll; 601: Film formation monitor; 602: Film formation monitor; 603: Film formation monitor; 604: Film formation monitor; 605: Film formation monitor; 606: Film formation monitor; 607: Film formation monitor; 608: Film formation monitor; 609: Film formation monitor shutter; 610: Film formation monitor shield; 611: Film formation monitor shield.

DETAILED DESCRIPTION OF THE INVENTION

The manufacturing method pertaining to the present invention will now be explained with reference to accompanying drawings.

In the present invention, flat glass plates, flat plastic plates, plastic sheets, tape-like materials produced from plastic sheets, etc. are preferably used as substrates to be coated. For use as optical filters or anti-reflection filters for display devices after providing them with a thin film, these substrates to be coated should preferably be transparent or translucent. When using a tape-like material produced from plastic sheets as the substrate to be coated, a thin film is produced by, for example, exposing it to a film-forming particle beam while the tape-like substrate to be coated, after winding it onto a substrate roll, is being rewound onto another substrate roll.

Firstly, the case of using a fixed film formation monitor or monitors is explained.

The larger the substrate to be coated, the greater the benefit of the present invention will be. The shorter side of the substrate to be coated (width of the tape-like substrate where one is used) should be 20 cm or more, preferably 26 cm or more.

Figure 8:
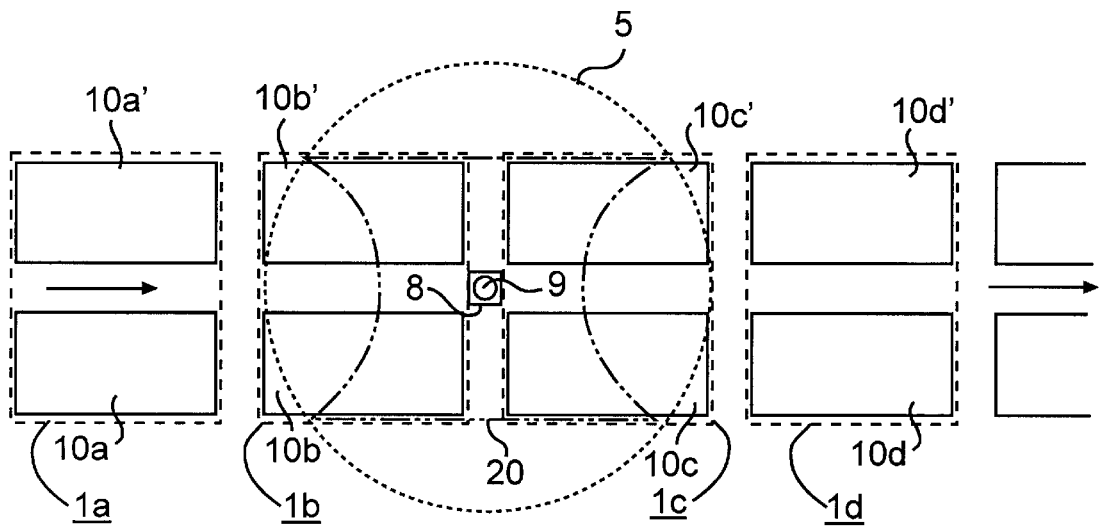
FIG. 8 shows the same manufacturing method as in FIG. 7 as viewed in the direction of the film-forming particle beam axis.

As shown in FIG. 8, it is also possible to arrange substrates to be coated in multiple columns in the direction of their movement and expose them to a film-forming particle beam simultaneously to produce a thin film. Apart from column arrangements in which substrates to be coated may be placed along a straight line, substrates to be coated can also be placed along curves such as circles. For example, it is possible to arrange substrates to be coated in a circle and turn them around the center of the circle to cause the substrates to pass through the film formation area repeatedly.

The "region clear of the area where the substrates to be coated are exposed to a film-forming particle beam" means any point that falls inside the film-forming particle beam (space through which a sufficient quantity of film-forming particles to form a monitor thin film pass) but, when viewed from the film-forming particle beam generating source, appears outside the area through which the substrates to be coated pass to be exposed to the film-forming particle beam as they are moved along their path (film formation area). When the substrates to be coated are arranged as multiple columns, gaps between substrate to be coated columns are deemed to be part of the film formation area (film formation area 20 in FIG. 8).

In the present invention, the "region clear of the substrate to be coated columns" refers to the space which is inside the film-forming particle beam but appears outside the substrate to be coated columns when viewed from the film-forming particle beam generating source.

In the present invention, the "outer edge region of the film-forming particle beam" refers to the space which is inside the film-forming particle beam but excludes the vicinity of the film-forming particle beam axis.

When a fixed film formation monitor or monitors is/are used, the installation location or locations needs/need to be outside of the film formation area. As long as this condition is satisfied, the relationship between the thickness of the thin film formed on the film formation monitor or monitors and that of the thin film formed on the substrates to be coated can be established without imposing restrictions on the arrangement of substrates to be coated, etc. Moreover, since any obstacle which may lie between the film-forming particle beam generating source and film formation monitor or monitors can be eliminated, it becomes possible to form a monitor thin film or films that is/are similar in quality to the thin film formed on the substrates to be coated, and this enables accurate control of the film coating process.

FIG. 1 shows a plan view of a first typical implementation mode of the thin-film-coated substrate manufacturing method and apparatus pertaining to the present invention. This is identical to the conventional manufacturing method shown in FIG. 8, except that the film formation monitoring plate 208 is placed clear of the film formation area to measure the thickness of the monitor thin film. The film formation monitoring plate 208 is located clear of the film formation area 220, shifted in a direction perpendicular to both the movement of the substrates to be coated 210 and the film-forming particle beam axis 9. Since the film formation monitoring plate 208 is placed at this location, it is possible to produce a thin film on substrates to be coated 210 that are more than twice the size compared to FIG. 8. Placing the film formation monitor outside of the rows of substrates to be coated as in the case of this implementation mode is preferable in that the distance between the film formation monitor and film-forming particle beam generating source can be brought closer to that between the substrates to be coated and film forming particle beam generating source.

Figure 2:
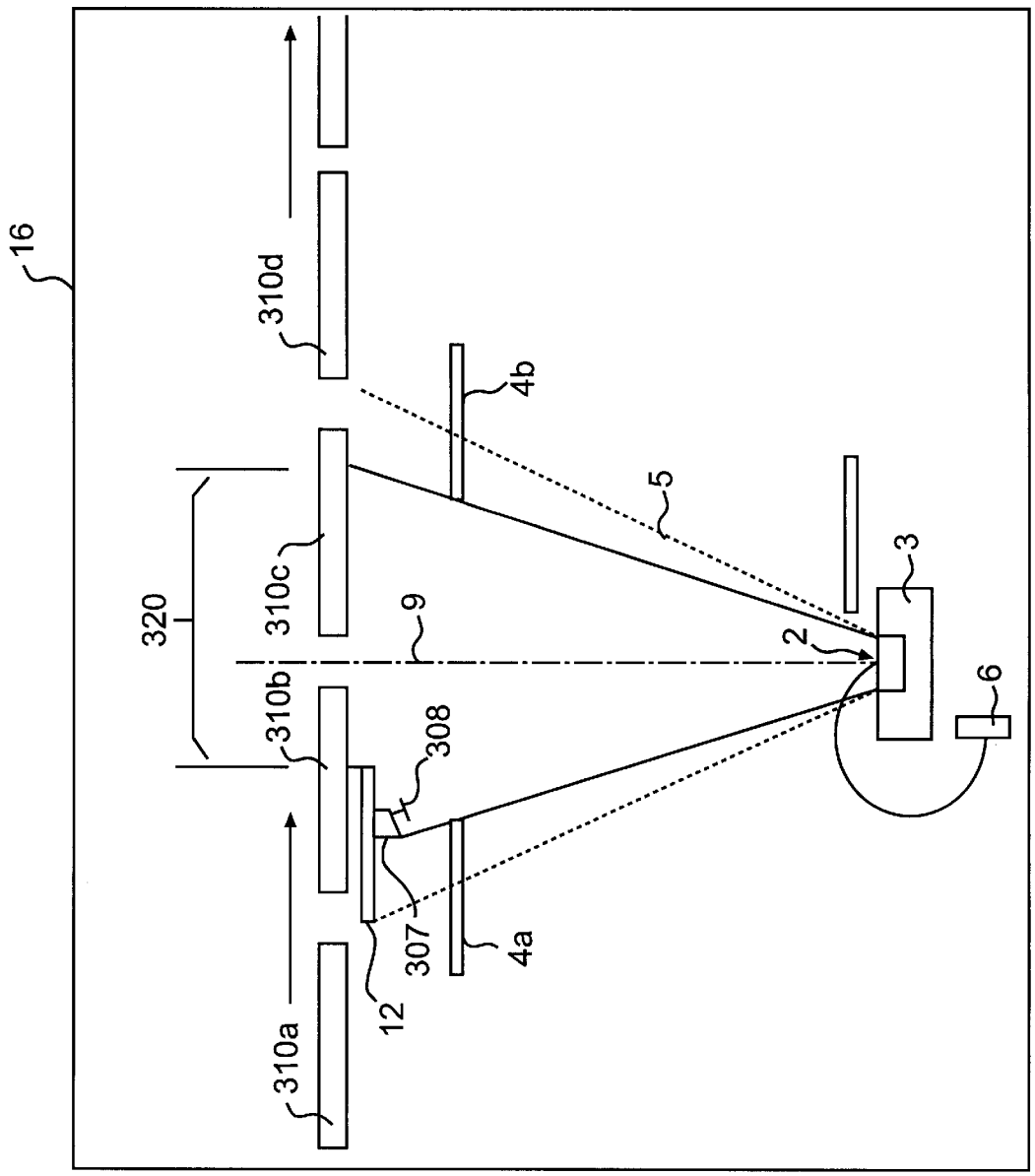
FIG. 2 shows the location of the film formation monitor in a second typical implementation of the thin-film-coated substrate manufacturing method pertaining to the present invention.

FIG. 2 shows a second implementation mode of the thin-film-coated substrate manufacturing method and apparatus pertaining to the present invention. This implementation mode is identical with the conventional manufacturing method shown in FIG. 7, except that the monitor thin film is measured by placing the film formation monitoring plate 308 on the film-forming particle beam shield 12 (film formation area limiting element) on its film-forming particle beam generating source side. The film formation monitoring plate 308 is located clear of the film formation area 320, shifted in the direction opposite to the movement direction of the substrates to be coated 310. Although a film-forming particle beam shield 12 is placed between both the film formation monitoring plate 308 and film thickness measuring device 307 and the substrates to be coated 310 in this implementation mode, a corrector plate 4 may be placed at this location instead. Since the film formation monitoring plate 308 is placed at this location, it is possible to produce a thin film on substrates to be coated 310 that are more than twice the size compared to FIG. 7. Where the film formation monitor is placed on a film formation area limiting element on its film-forming particle beam generating source side, conditions such as the kinetic energy and number of particles reaching the film formation monitor are similar to those of film-forming particles reaching the film formation area, which is desirable.

FIG. 3 shows a third implementation mode of the thin-film-coated substrate manufacturing method and apparatus pertaining to the present invention. This implementation mode uses a tape-like material as the substrate to be coated 418, on which thin film is produced by exposing it to a film-forming particle beam 5, while it, after being wound onto a substrate roll 419a, is rewound onto another substrate roll 419b. The film formation monitoring plate 408 is placed at a location outside of the film formation area 420, shifted in the direction opposite to the movement direction of the substrate to be coated 418. Although a film-forming particle beam shield 412 is placed between both the film formation monitoring plate 408 and film thickness measuring device 407 and the substrate to be coated 418 in this implementation mode, a corrector plate 4 can be placed at this location instead. Since the film formation monitoring plate 408 is placed at this location, it is possible to produce a thin film on a substrate to be coated 418 that has a width equal to the full width of the film formation area 420.

Figure 4:
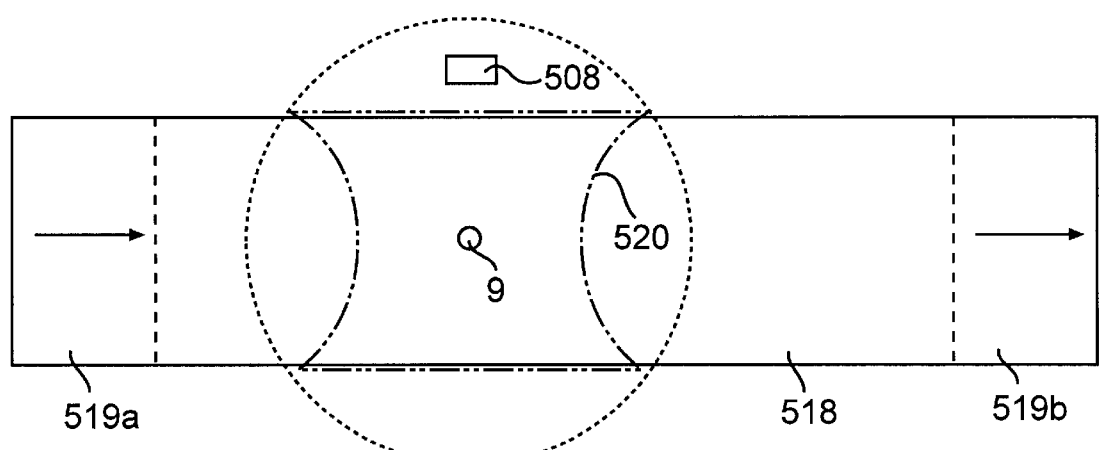
FIG. 4 shows the location of the film formation monitor in a plan view of a fourth typical implementation of the thin-film-coated substrate manufacturing method pertaining to the present invention.

FIG. 4 shows a fourth implementation mode of the thin-film-coated substrate manufacturing method and apparatus pertaining to the present invention. This implementation mode uses a tape-like material as the substrate to be coated 518, on which thin film is produced by exposing it to a film-forming particle beam 5, while it, after being wound onto a substrate roll 519a, is rewound onto another substrate roll 519b. The film formation monitoring plate 508 is placed at a location outside of the film formation area 520, shifted in the width direction of the substrate to be coated 518. Since the film formation monitoring plate 508 is placed at this location, it is possible to produce a thin film on a substrate to be coated 518 that has a width equal to the full width of the film formation area 520.

Next the case of the film formation monitor or monitors being mobile is explained.

The larger the substrate to be coated or the larger the number of product varieties (or sizes) to be manufactured, the greater the benefit of the present invention will be. The shorter side of the substrate to be coated (width of the tape-like substrate where one is used) should be 20 cm or more, preferably 26 cm or more.

As shown in FIG. 8, it is also possible to arrange substrates to be coated in multiple columns in the direction of their movement and expose them to a film-forming particle beam simultaneously to produce a thin film. Apart from column arrangements in which substrates to be coated may be placed along a straight line, substrates to be coated can also be placed along curves such as circles. For example, it is possible to arrange substrates to be coated in a circle and turn them around the center of the circle to cause the substrates to pass through or move within the film formation area repeatedly.

The transportation of the substrates to be coated should preferably be carried out in such a way that they are mounted on substrate holders or domes, which are moved within or passed through the area exposed to the film-forming particle beam. When a tape-like material produced from plastic sheets is used as the substrate to be coated, it is preferable that it first be wound onto a substrate roll and then rewound onto another substrate roll.

Mobile film formation monitors need to be mobile within the area exposed to the film-forming particle beam, so that they can be placed at suitable locations inside the film-forming particle beam, which are not blocked by substrates to be coated, according to the size and shape of the substrates to be coated. The location of a film formation monitor here refers to the location of the section of a film formation monitor on which a monitor thin film is formed. If the above condition is met, any potential obstacle between the film-forming particle beam generating source and film formation monitor can be eliminated, and this makes it possible to form a monitor thin film that is similar in quality to the thin film produced on the substrates to be coated, thus allowing accurate control of the film coating process. While it is desirable that the mobility range of the film formation monitor ranges from the vicinity of the film-forming particle beam axis, which is included in the area where substrates to be coated are exposed to the film-forming particle beam, to the outer edge region of the film-forming particle beam, it may just be set in the area where the substrates to be coated are exposed to the film-forming particle beam, if, for example, thin films are always produced by arranging the substrates to be coated in multiple columns. In this case, it is desirable because the film thickness etc. can be monitored in the vicinity of the film-forming particle beam axis. Also, where it is required to control the film formation process via a film formation monitor even when the width of the substrate to be coated equals the full width of the film formation area, it is preferable that the film formation monitor be mobile outside of the area where the substrates to be coated are exposed to the film-forming particle beam, as well as one overlapping it.

The mobility range of the film formation monitor may only be set outside of the area where the substrates to be coated are exposed to the film-forming particle beam. When placing the film formation monitor in the area where the substrates to be coated are exposed to the film-forming particle beam, some film-forming particles sometimes get blocked by the substrates to be coated, etc., since their movement path is located closer to the film-forming particle beam generating source than the mobile range of the film formation monitor as mentioned above (in particular when the gap between substrate to be coated columns is small). In the end, therefore, the most suitable location to place the film formation monitor often turns out to be one which is just clear of the film formation area. As a result, the mobility range of the film formation monitor may be set in the region which is clear of the area where the substrates to be coated are exposed to the film-forming particle beam.

Figure 10:
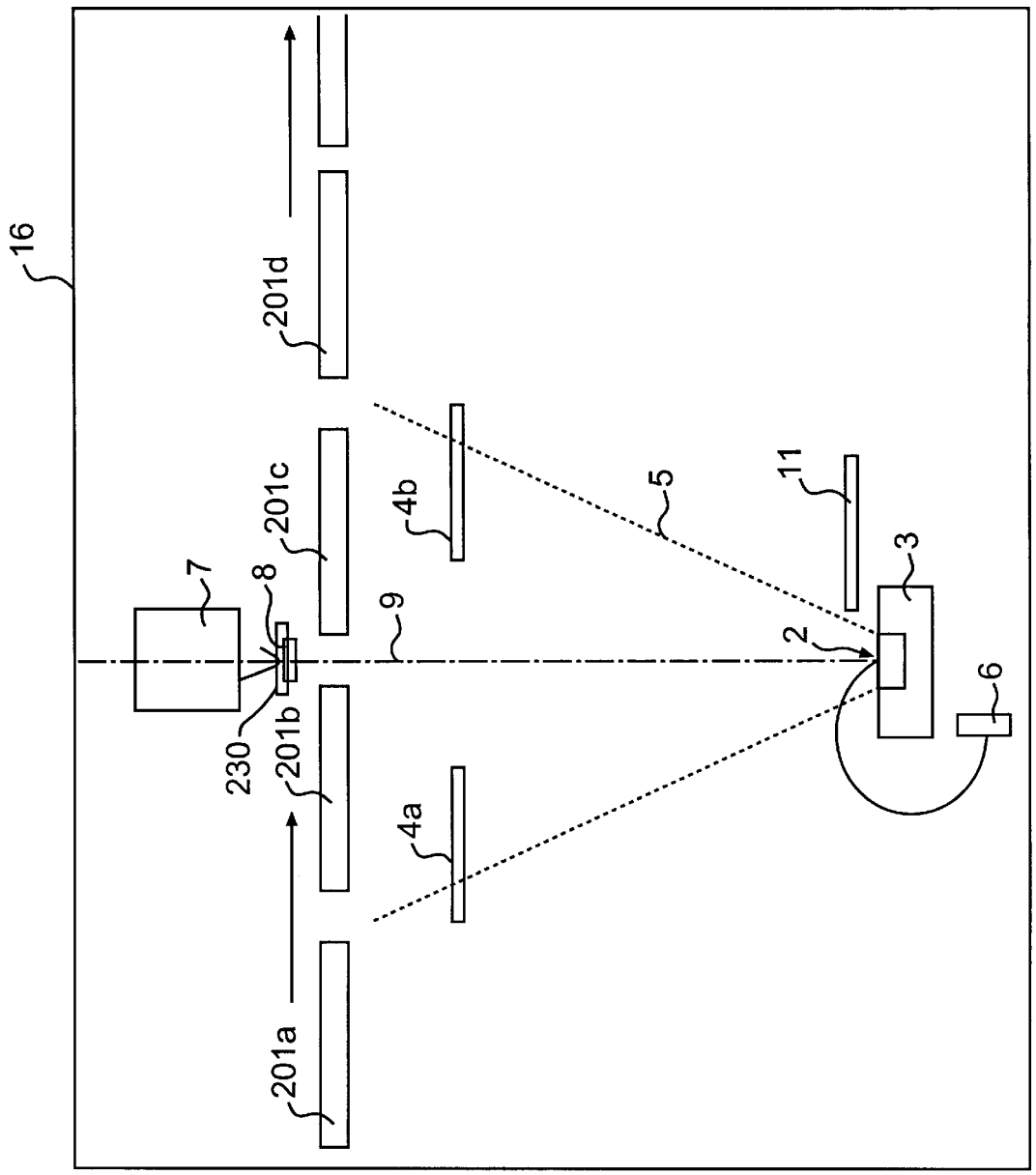
FIG. 10 shows the location of the film formation monitor in a fifth typical implementation of the thin-film-coated substrate manufacturing method pertaining to the present invention.
Figure 11:
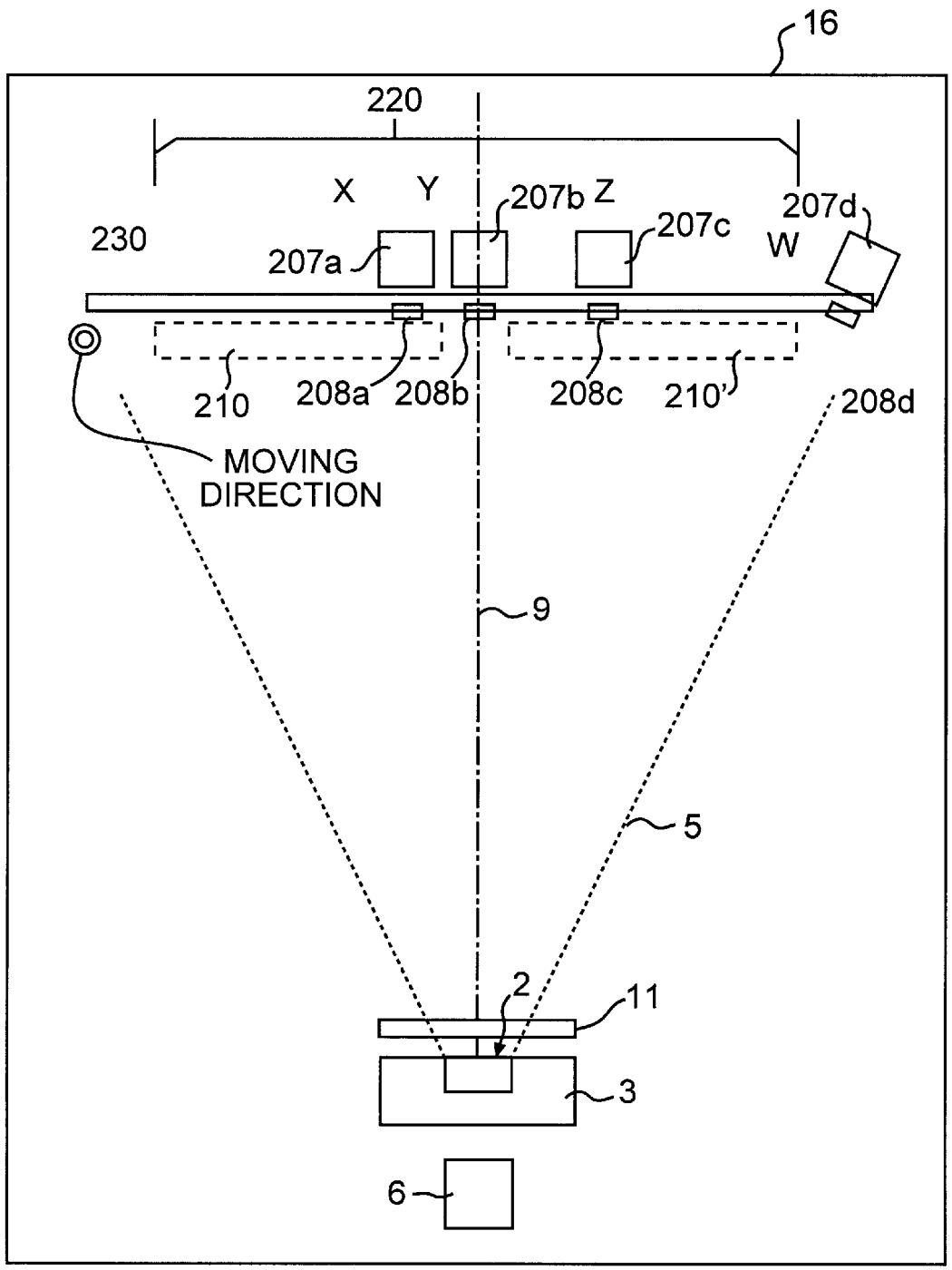
FIG. 11 shows the same implementation as in FIG. 10 as viewed in the direction opposite that of the movement of the film coating target substrate.

FIG. 10 shows a fifth typical implementation mode of the present invention. This mode is identical with the one shown in FIG. 8, except that the film formation monitoring plate 8 and film thickness measuring device 7 are made mobile in directions perpendicular to the page through the introduction of a film formation monitor movement mechanism 230. FIG. 11 shows the same implementation as FIG. 10 but as viewed in the direction opposite to that of the movement of the substrates to be coated 210. It is possible to move the film formation monitoring plate 8 and film thickness measuring device 7 according to the size of the substrates to be coated 210.

Figure 12:
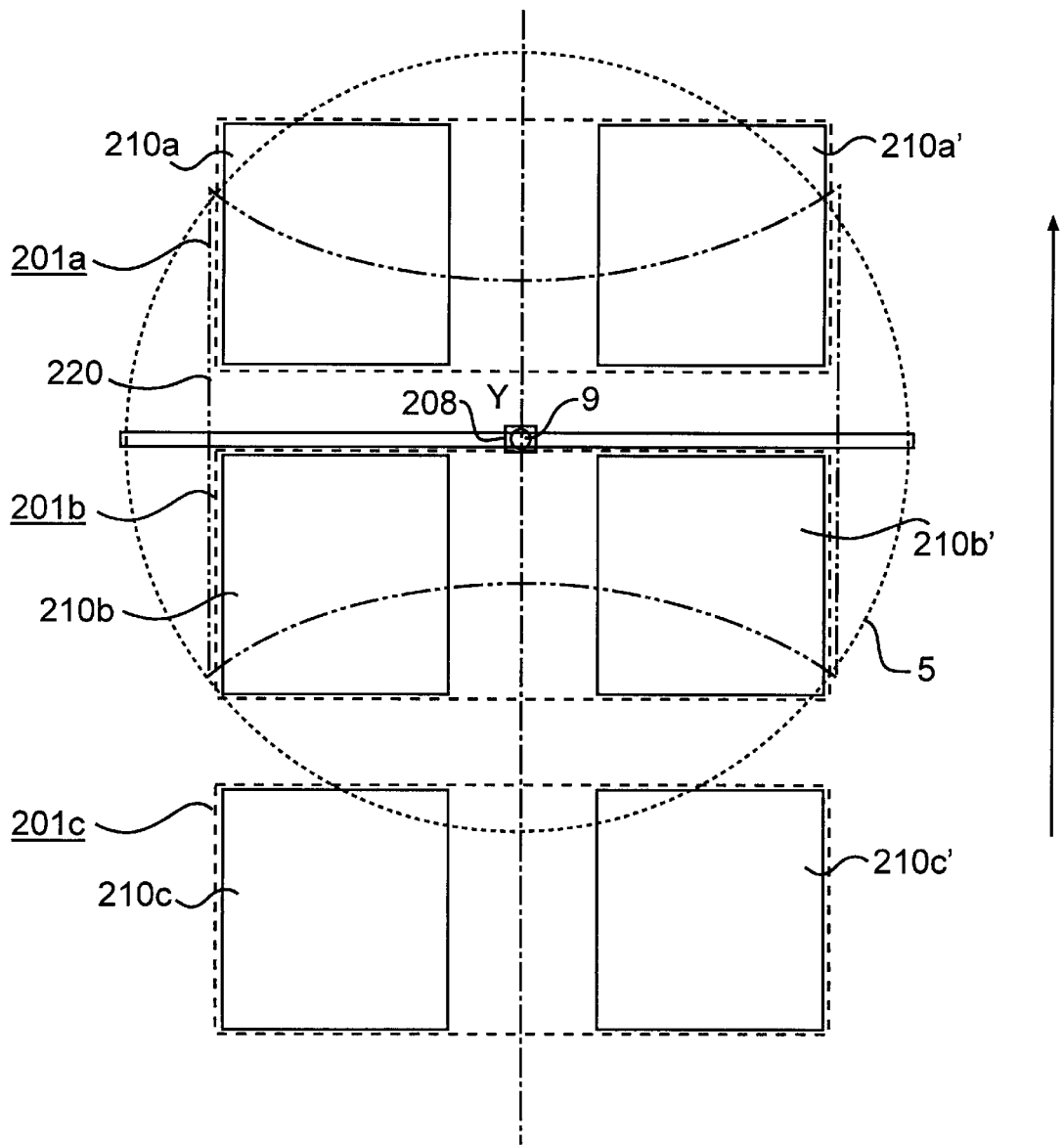
FIG. 12 shows a first alternative location of the film formation monitor in the thin-film-coated substrate manufacturing method of FIGS. 10 and 11.
Figure 13:
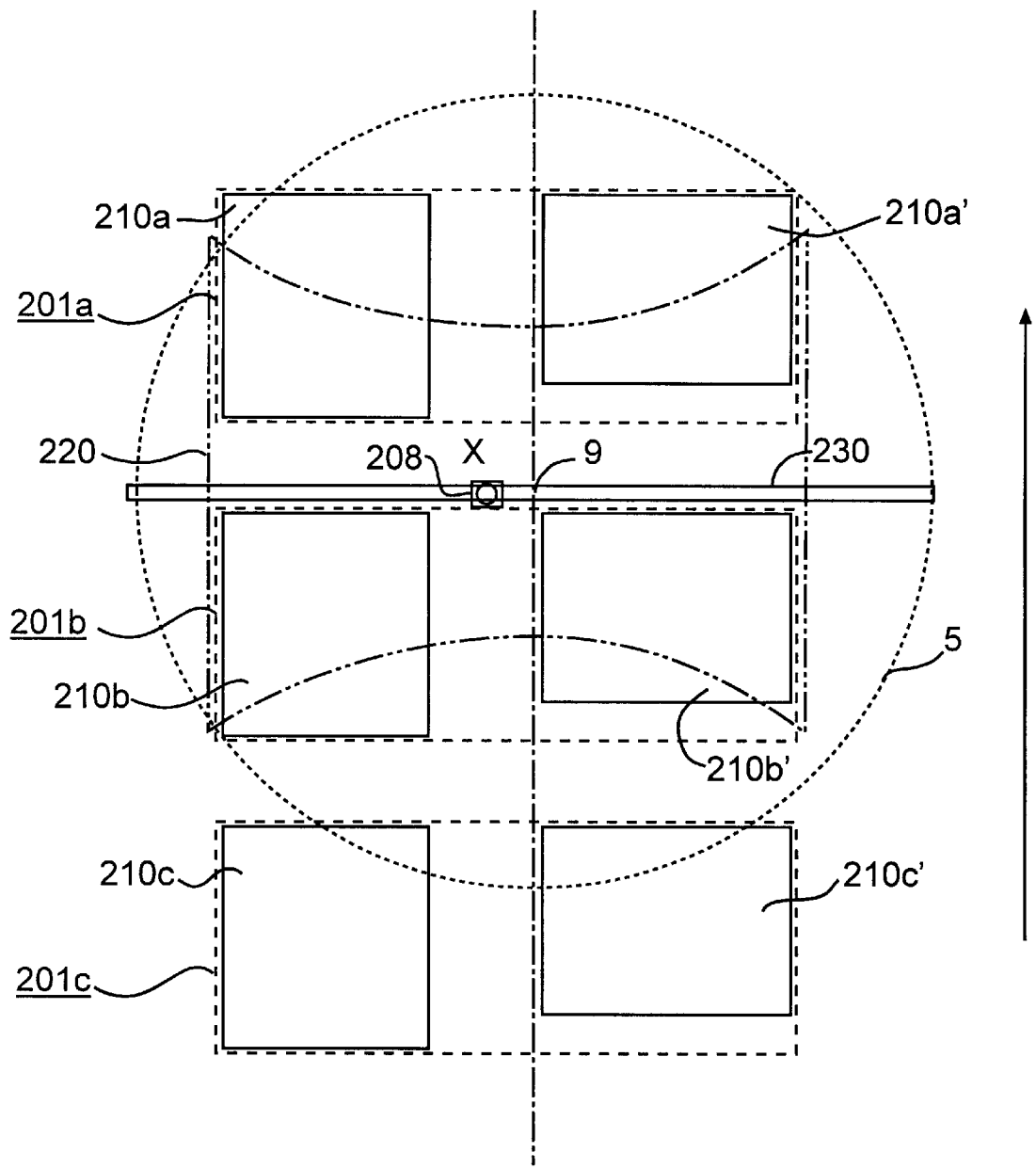
FIG. 13 shows a second alternative location of the film formation monitor in the thin-film-coated substrate manufacturing method of FIGS. 10 and 11.
Figure 14:
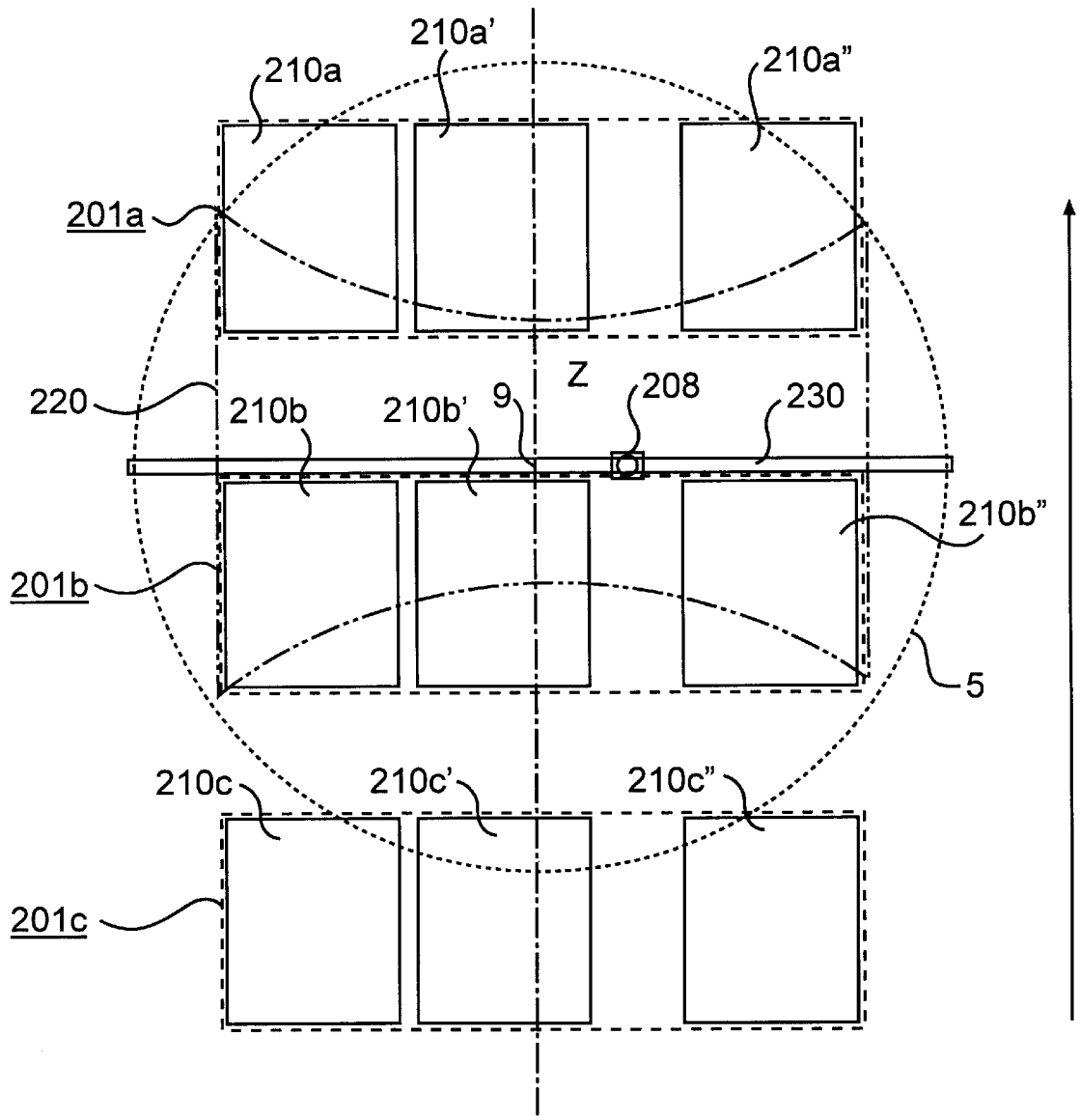
FIG. 14 shows a third alternative location of the film formation monitor in the thin-film-coated substrate manufacturing method of FIGS. 10 and 11.
Figure 15:
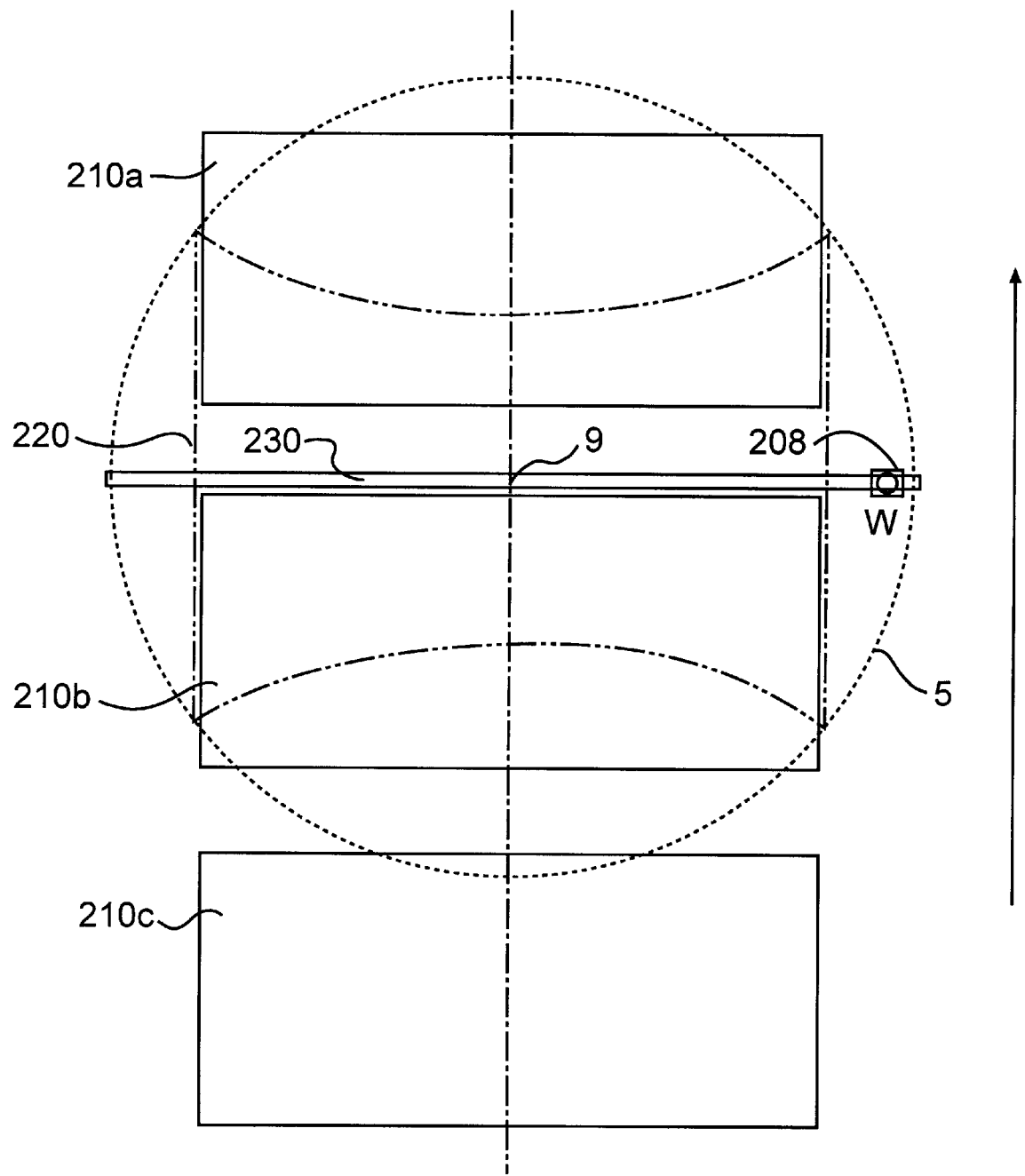
FIG. 15 shows a fourth alternative location of the film formation monitor in the thin-film-coated substrate manufacturing method of FIGS. 10 and 11.

FIGS. 12 to 15 show alternative examples of suitable film formation monitor locations, when producing a thin film on substrates to be coated of various sizes, and their implementation is the same as the fifth implementation of FIGS. 10 and 11, except that the view is looking down at the film coating target substrate surface. FIG. 12 shows a film formation monitor location suitable for film coating carried out by arranging the substrates to be coated in two columns, and in this case it is preferable that the film formation monitor be placed at Y, which lies in the vicinity of the film-forming particle beam axis 9. FIG. 13 shows a film formation monitor location suitable for film coating carried out by arranging the substrates to be coated in columns with varying widths, and in this case it is preferable that the film formation monitor be placed at X, which lies somewhat away from the film-forming particle beam axis 9 towards the substrate to be coated column with a narrower width. FIG. 14 shows a film formation monitor location suitable for film coating carried out by arranging the substrates to be coated in three columns, and in this case it is preferable that the film formation monitor be placed at Z, which lies away from the film-forming particle beam axis 9 by about ⅙ the width of the film formation area. FIG. 15 shows a film formation monitor location suitable for film coating carried out by arranging large-sized substrates to be coated in a single column, and in this case it is preferable that the film formation monitor be placed outside of the film formation area.

Although the mobility range of the film formation monitor was set to include both the region clear of the area where the substrates to be coated are exposed to the film-forming particle beam and one overlapping it in this implementation mode, it may be limited to either one of them.

It is also preferable that film formation conditions of the monitor thin film formed on the film formation monitor be similar to those of the thin film formed on the substrates to be coated. Although it depends on the nature of the intended thin film, it is desirable that the monitor thin film have physical characteristics, such as refractivity index, density and electric characteristics, as well as a film thickness similar to those of a thin film formed within the film formation area.

It is desirable that there be two or more film formation monitors. When producing a thin film on substrates to be coated on a continuous basis, film-forming particles continuously accumulate on the film formation monitors. In this case, the monitoring of film formation sometimes becomes inadequate, as the characteristics of the thin film produced, such as refractive index, density and electric characteristics, fluctuate due to fluctuations in film formation conditions. This can be dealt with by keeping at least one of the film formation monitors covered with a shutter, etc. and using it when the characteristics of the thin film produced have changed. When film coating is carried out continuously for several hours, the thin films formed on the monitor plates sometimes come off due to their own weight or internal stress. This kind of situation can also be dealt with in a similar manner. Moreover, if two or more film formation monitors are used, stable monitoring of film formation becomes possible by switching over from one film formation monitor to another at predetermined intervals.

Until the present invention, it was necessary to temporarily stop the film coating process, when an abnormality was observed on the thin film formed on the monitor plate for some reason, and it was resumed halfway through the process, resulting in a great time loss consisting of the interruption time and the time required to reestablish the stable film formation conditions existent before the interruption. Nevertheless, where the resumption of the process in this way was possible at all, it was less of a problem. Namely, the process interruption in the middle of film formation tended to cause a deterioration in the physical properties of the thin film, such as adherence and wear resistance and deviation from the specified optical characteristics, such as film thickness and refractivity, often leading to rejection. This type of problem can also be eliminated.

Where it is not preferable to incorporate a lot of film formation monitor mechanisms as it would increase the price of the apparatus, measures may be taken such as using two or more film formation monitors for each film formation monitor mechanism or making the film formation section of each film formation monitor plate replaceable, with at least two film formation monitor mechanisms provided. While one of the monitor mechanisms is in use, the film formation monitor of the other monitor mechanism is shielded with a shutter, etc. For example, after film coating is carried out for an appropriate length of time, the shutter, until then used as a shield, is opened to commence film formation monitoring. Then, the film formation monitor or the film formation element of the film formation monitor on the other monitor mechanism is replaced using the film formation monitor initially in operation as a shield, and this is repeated at suitable intervals. This is very convenient, although it is, of course, necessary to establish the precise relationship between film formation monitors.

It is preferable that the conditions below be met to make the film formation conditions of the monitor thin film similar to those of the thin film formed on the substrates to be coated, as discussed above.

The case of using fixed film formation monitors is first described.

Figure 5:
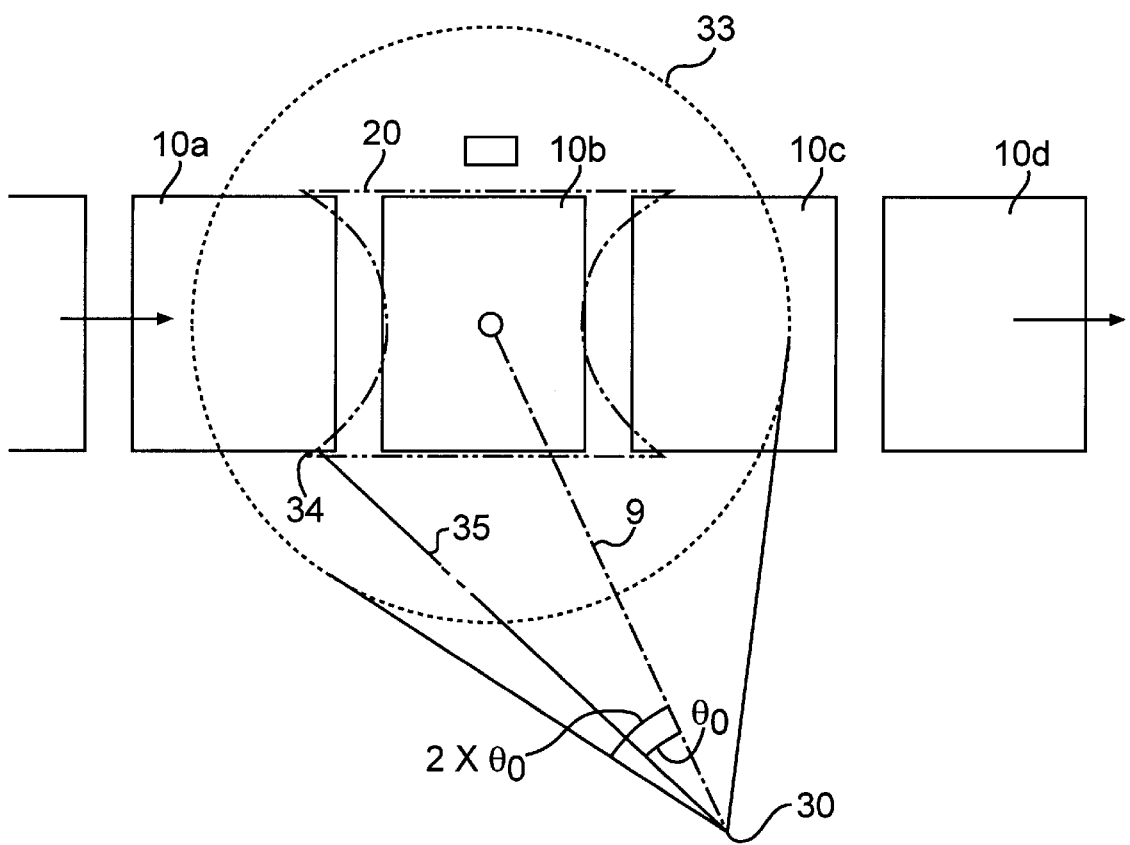
FIG. 5 shows a first desirable location of the film formation monitor in the thin-film-coated substrate manufacturing method pertaining to the present invention.

Firstly, it is desirable that the angle formed by the straight line connecting the location of the film formation monitor and the generating source of the film-forming particle beam and the film-forming particle beam axis, θ, be within twice the angle formed by the straight line connecting the generating source of the film-forming particle beam and the farthest point on the film formation area from it and the film-forming particle beam axis, θo. FIG. 5 shows this relationship. On the drawing, θo, represents the angle formed by straight line 35, which connects the generating source of the film-forming particle beam and the point 34, which, lying on the edge of the film formation area, gives the farthest point on the film formation area from it, and the film-forming particle beam axis 9. The conical surface 33 is a set of half-lines that start at the generating source of the film-forming particle beam and make an angle of 2×θo with the film-forming particle beam axis 9, containing said generating source as its apex. Therefore, the desirable range of the location of the film formation monitor can be described as being inside the conical surface 33 and appearing outside the film formation area when viewed from the generating source. When the generating source of the film-forming particle beam is of a size that cannot be regarded as a point, or multiple generating sources are used, it is desirable that the film formation monitor be located inside one of all the conical surfaces satisfying the above conditions, generated by all points on the generating source or all generating sources involved, and appear outside the film formation area when viewed from all points on the generating source or all generating sources. If the film formation monitor is placed within this region, it is possible to make the thickness and physical characteristics (e.g. refractive index, uniformity, density and electric characteristics) of the monitor thin film formed on it similar to the thin film formed on the substrates to be coated.

Figure 6:
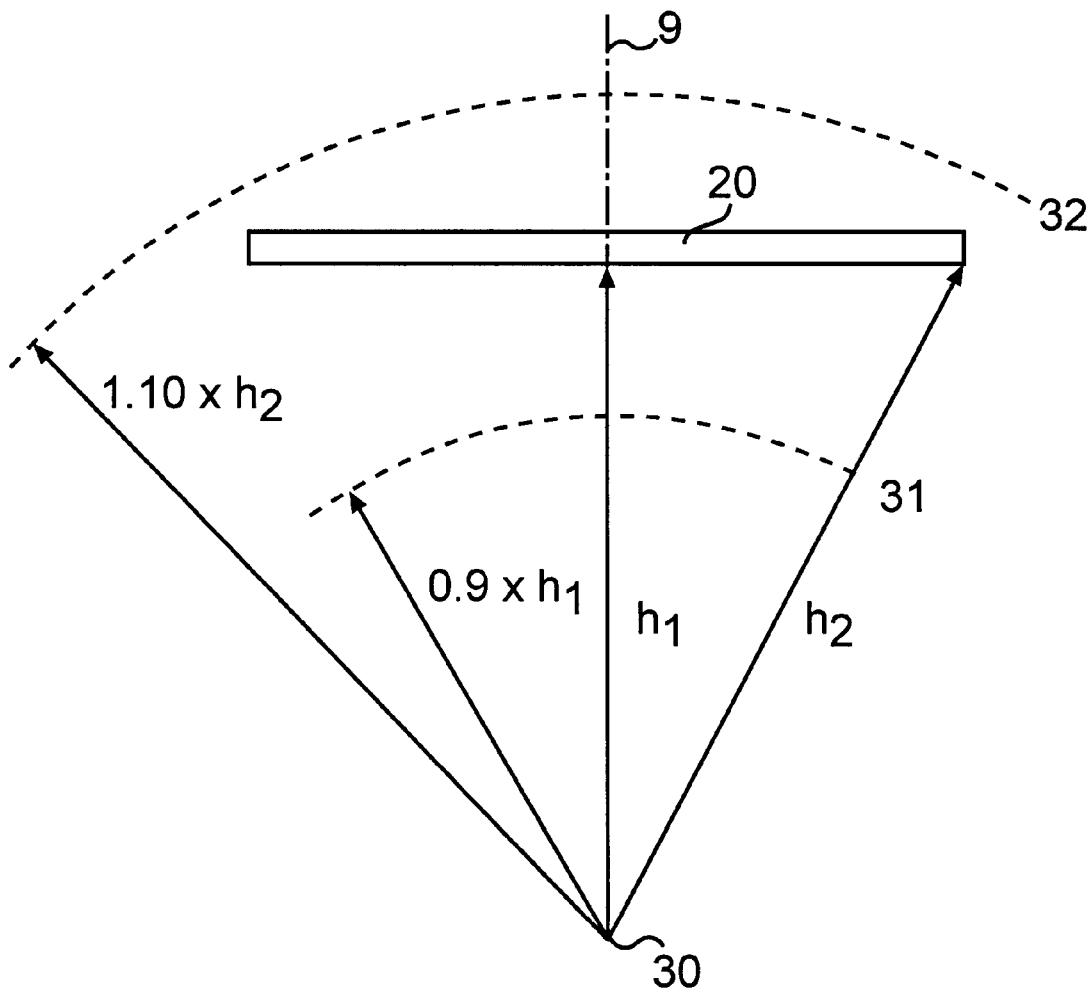
FIG. 6 shows a second desirable location of the film formation monitor in the thin-film-coated substrate manufacturing method pertaining to the present invention.

Secondly, it is preferable that the distance from the generating source of the film-forming particle beam to the film formation monitor be set to 0.9 times or more of the minimum distance from this generating source to the film formation area and 1.1 times or less of the maximum distance. FIG. 6 shows this relationship. On the diagram, h1 and h2 represent the minimum and maximum distances between the generating source of the film-forming particle beam and the film formation area, respectively. Locations at 0.9 times the minimum distance and 1.1 times the maximum distance from the generating source of the film-forming particle beam to the film formation area are all points on the spherical surfaces 31 and 32, both centered on this generating source, respectively. Therefore, the desirable range of the locations of the film formation monitor can be described as the space between the spherical surfaces 31 and 32 and the region appearing outside the film formation area when viewed from the generating source. When the generating source of the film-forming particle beam is of a size that cannot be regarded as a point, or multiple generating sources are used, it is preferable that the film formation monitor be located at one of the points which satisfy the above condition with respect to one point on said generating source or one generating source as well as appearing outside the film formation area when viewed from all points on the generating source or all generating sources. If the film formation monitor is placed within the region consisting of all these points, it is possible to make the thickness and physical characteristics (e.g. refractive index, uniformity, density and electric characteristics) of the monitor thin film formed on it similar to the thin film formed on the substrates to be coated. It is further preferable that the above-mentioned first condition also be met.

Thirdly, it is preferable that the angle formed by the straight line connecting the location of the film formation monitor and the generating source of the film-forming particle beam and the normal line to the monitor thin film formation surface on the film formation monitor, φ, be within 40', with within 30' being even more preferable. A large discrepancy between the lines generated by the formation direction of the thin film (which coincides with the outward direction along the normal line to the monitor thin film formation surface) and the traveling direction of incoming film-forming particles during the formation of a monitor thin film gives rise to so-called oblique-incidence deposition, and this frequently results in a monitor thin film deviating greatly from the thin film formed on the substrates to be coated placed in the vicinity of the film-forming particle beam axis, i.e. the film formation area, in terms of physical and other characteristics. However, where it is specifically required to make its film formation conditions coincide with those near the outer edge of the film formation area, it is preferable that the above-mentioned angle be set close to the angle between the traveling direction of film-forming particles and the film formation direction of the thin film at such a location. It is further preferable that either the above-mentioned first or second, or both conditions also be met simultaneously.

The case of the film formation monitors being mobile is explained next.

Firstly, it is desirable that at least a part of the range of the angle formed by the straight line connecting the location of the film formation monitor and the generating source of the film-forming particle beam and the film-forming particle beam axis, θ, be within twice the angle formed by the straight line connecting the generating source of the film-forming particle beam and the farthest point on the film formation area from it and the film-forming particle beam axis, θo. FIG. 5 shows this relationship. On the drawing, θo represents the angle formed by straight line 35, which connects the generating source of the film-forming particle beam and the point 34, which, lying on the edge of the film formation area, gives the farthest point on the film formation area from it, and the film-forming particle beam axis 9. The conical surface 33 is a set of half-lines that start at the generating source of the film-forming particle beam and make an angle of 2×θo with the film-forming particle beam axis 9, containing said generating source as its apex. Therefore, the desirable range of the location of the film formation monitor can be described as being inside the conical surface 33. In addition, it is even more preferable that the film formation monitor be placed in the region that appears outside the film formation area when viewed from the film-forming particle beam generating source as this can prevent the substrate to be coated from blocking film-forming particles. However, where a large gap can be obtained between substrate to be coated columns, locations within the film formation area are actually desirable. When the generating source of the film-forming particle beam is of a size that cannot be regarded as a point, or multiple generating sources are used, it is desirable that the film formation monitor be located inside one of all the conical surfaces satisfying the above conditions, generated by all points on the generating source or all generating sources involved, and appear outside the film formation area when viewed from all points on the generating source or all generating sources. If the film formation monitor is placed within this region, it is possible to make the thickness and physical characteristics (e.g. refractive index, uniformity, density and electric characteristics) of the monitor thin film formed on it similar to the thin film formed on the substrates to be coated.

Secondly, it is preferable that at least a part of the range of the distance from the generating source of the film-forming particle beam to the film formation monitor be set to 0.9 times or more of the minimum distance from this generating source to the film formation area and 1.1 times or less of the maximum distance. FIG. 6 shows this relationship. On the diagram, $h_1$ and $h_2$ represent the minimum and maximum distances between the generating source of the film-forming particle beam and the film formation area, respectively. Locations at 0.9 times the minimum distance and 1.1 times the maximum distance from the generating source of the film-forming particle beam to the film formation area are all points on the spherical surfaces 31 and 32, both centered on this generating source, respectively. Therefore, the desirable range of the locations of the film formation monitor can be described as the space between the spherical surfaces 31 and 32. Furthermore, it is even more preferable that the film formation monitor be placed outside the film formation area when viewed from the generating source as this can eliminate the problem of the substrate to be coated blocking film-forming particles. However, where a large gap between substrate to be coated columns can be obtained, a location within the film formation area is actually desirable. When the generating source of the film-forming particle beam is of a size that cannot be regarded as a point, or multiple generating sources are used, it is preferable that the film formation monitor be placed at a location that satisfies the above distance condition with respect to all points on the generating source or all generating sources. If the film formation monitor is placed within the region consisting of all these points, it is possible to make the thickness and physical characteristics (e.g. refractive index, uniformity, density and electric characteristics) of the monitor thin film formed on it similar to the thin film formed on the substrates to be coated. It is further preferable that the above-mentioned first condition also be met.

Thirdly, it is preferable that at least a part of the range of the angle formed by the straight line connecting the location of the film formation monitor and the generating source of the film-forming particle beam and the normal line to the monitor thin film formation surface on the film formation monitor, φ, be within 40', with within 30' being even more preferable. A large discrepancy between the lines generated by the formation direction of the thin film (which coincides with the outward direction along the normal line to the monitor thin film formation surface) and the traveling direction of incoming film-forming particles during the formation of a monitor thin film gives rise to so-called oblique-incidence deposition, and this frequently results in a monitor thin film deviating greatly from the thin film formed on the substrates to be coated placed in the vicinity of the film-forming particle beam axis, i.e. the film formation area, in terms of physical and other characteristics. However, where it is specifically required to make its film formation conditions coincide with those near the outer edge of the film formation area, it is preferable that the above-mentioned angle be set close to the angle between the traveling direction of film-forming particles and the film formation direction of the thin film at such a location. It is further preferable that either the above-mentioned first or second, or both conditions also be met simultaneously.

Where there are two or more film formation monitors, they should be arranged in such a way that all their locations satisfy the above-mentioned geometrical relationship. Preferably, they should be placed at symmetrical locations with respect to the center of the film-forming particle beam generating source or in proximity to each other.

Figure 16:
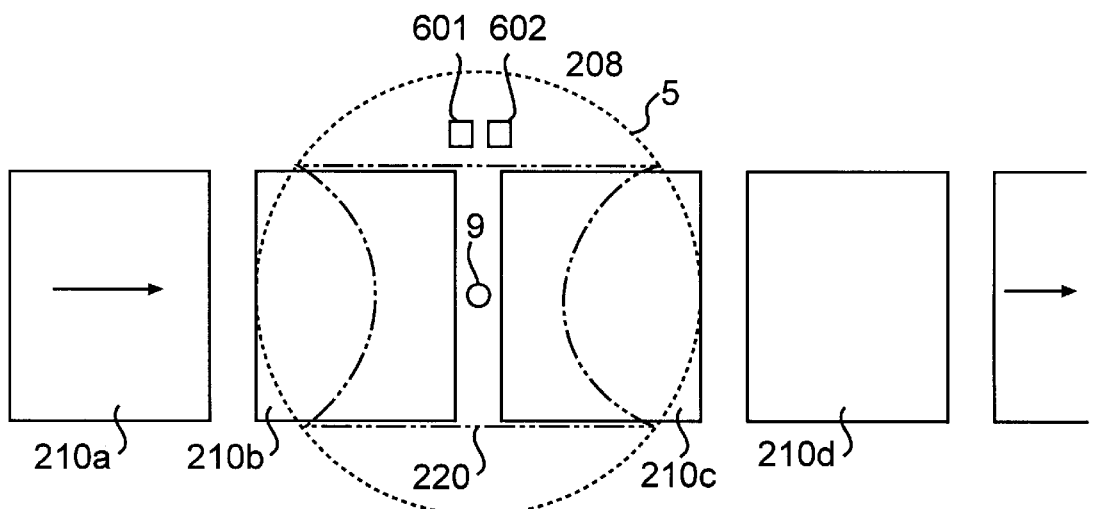
FIG. 16 shows the locations of film formation monitors in a typical implementation of the thin-film-coated substrate manufacturing method in the embodiment of FIG. 1.
Figure 9:
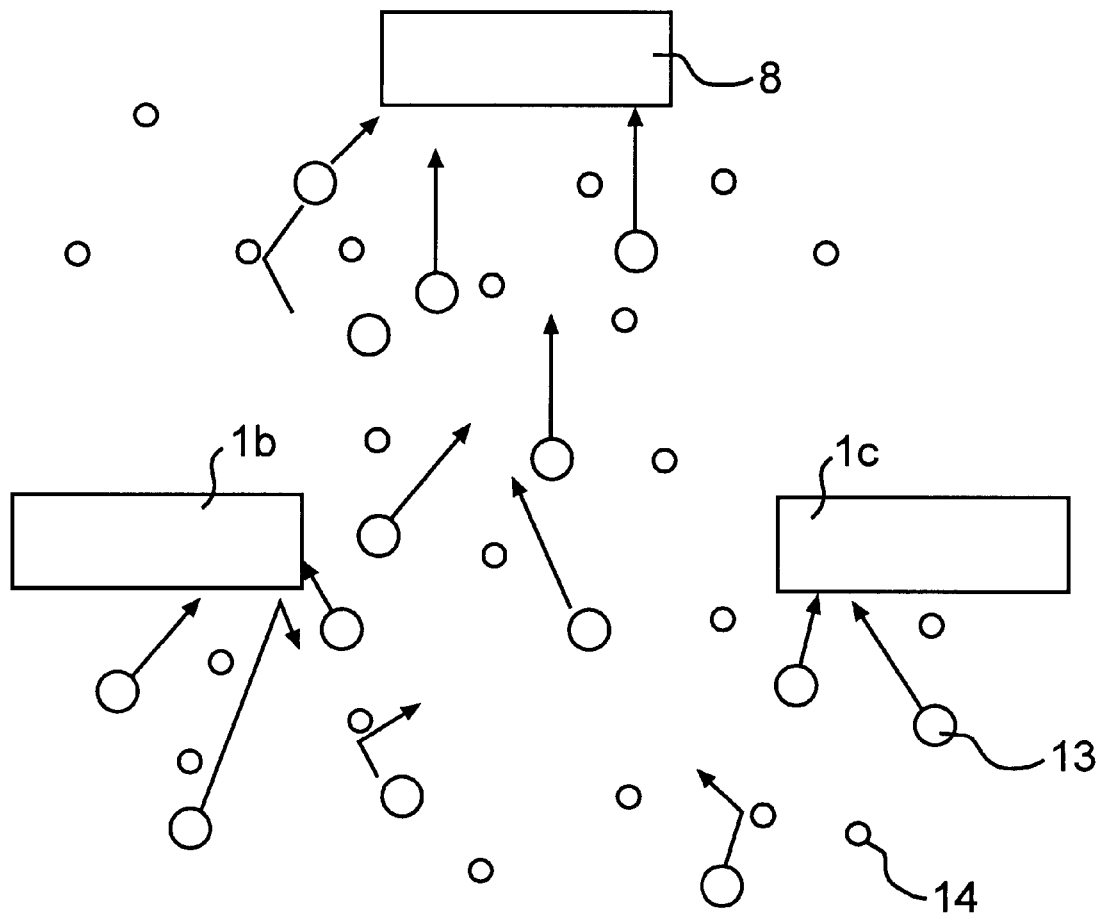
FIG. 9 shows how a monitor thin film is formed on a conventional film formation monitor.

FIG. 16 is a typical implementation mode that incorporates two film formation monitor mechanisms in the embodiment shown in FIG. 1. The film formation monitors 601 and 602 are placed in proximity to each other and are located within the monitor location range shown in FIGS. 5 and 6. The film formation monitors 601 and 602 are identical in terms of the geometric relationship between the surface of the film formation monitor and the film-forming particle beam generating source.

Figure 17:
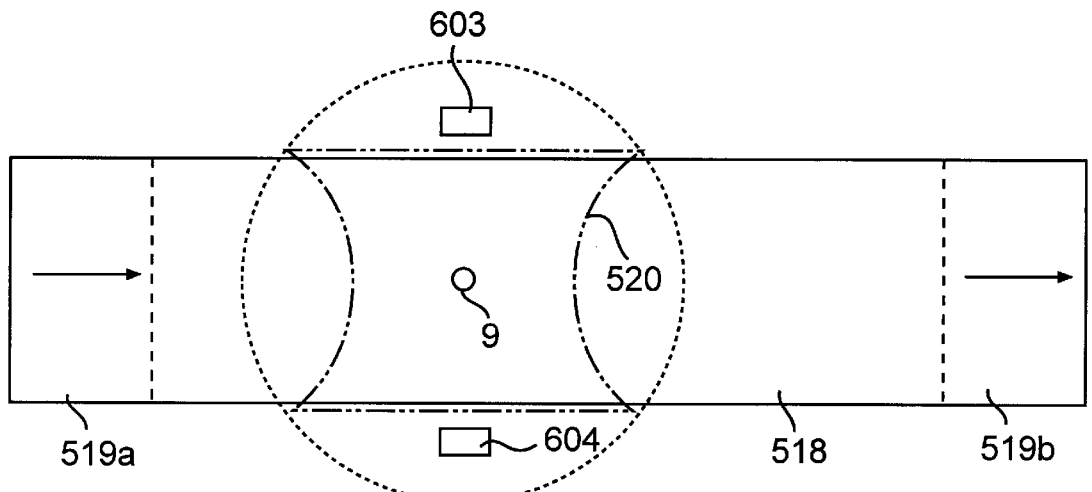
FIG. 17 shows the locations of film formation monitors in a typical implementation of the thin-film-coated substrate manufacturing method in the embodiment of FIG. 4.

FIG. 17 is another implementation mode that incorporates two film formation monitor mechanisms in the embodiment shown in FIG. 4. The film formation monitors 603 and 604 are placed at symmetrical locations with respect to the center of the film-forming particle beam generating source, lying on a straight line that is perpendicular to the axis along which the substrates to be coated move, so that the content of information obtainable from the film formation monitors 603 and 604 is almost identical.

Figure 18:
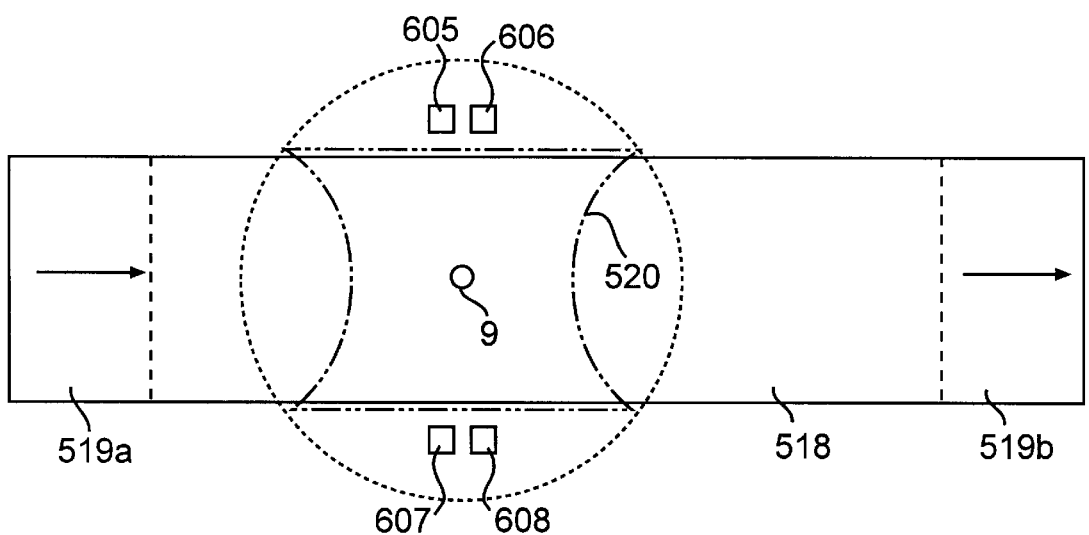
FIG. 18 shows the locations of film formation monitors in another typical implementation of the thin-film-coated substrate manufacturing method pertaining to the present invention.

FIG. 18 shows an implementation mode that combines those shown in FIGS. 16 and 17. This makes it possible to add feedback control to the distribution of film formation conditions in the film formation area in either direction that is perpendicular to the direction of the movement of the substrate to be coated, when inconsistency arises in this direction. For example, when the film formation monitors 605 and 607 are used and the film formed on 607 becomes thicker than that on 605, a control is applied to increase the quantity of film-forming particles traveling to 607. In other words, this is a control method that aims to keep the film thickness of 605 and that of 607 in line with each other.

Figure 19:
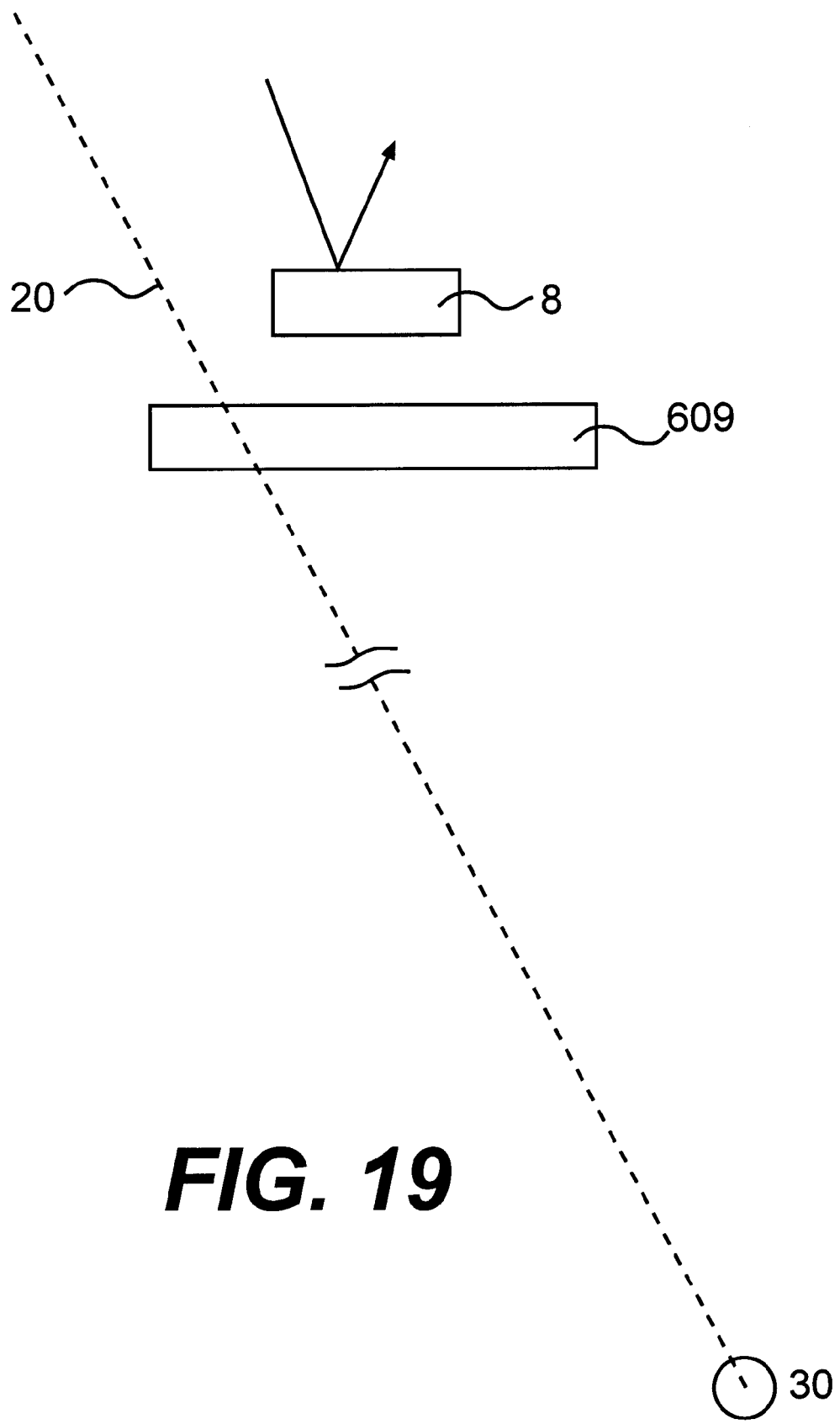
FIG. 19 shows the shutter of a film formation monitor in the thin-film-coated substrate manufacturing method pertaining to the present invention.

FIG. 19 shows an implementation mode of a film formation monitor shutter, denoted as 609. It is preferable that the shutter be placed as close to the monitor plate as possible and of a size which ensures that it does not interfere with film-forming particles traveling to the substrates to be coated.

Figure 20:
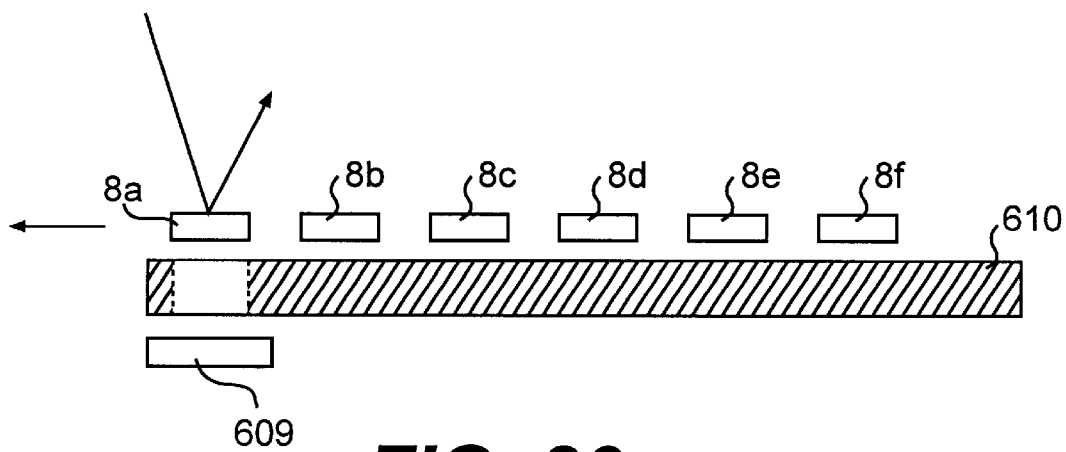
FIG. 20 shows the multiple film formation monitors and their shields in a thin-film-coated substrate manufacturing method embodiment pertaining to the present invention.
Figure 21:
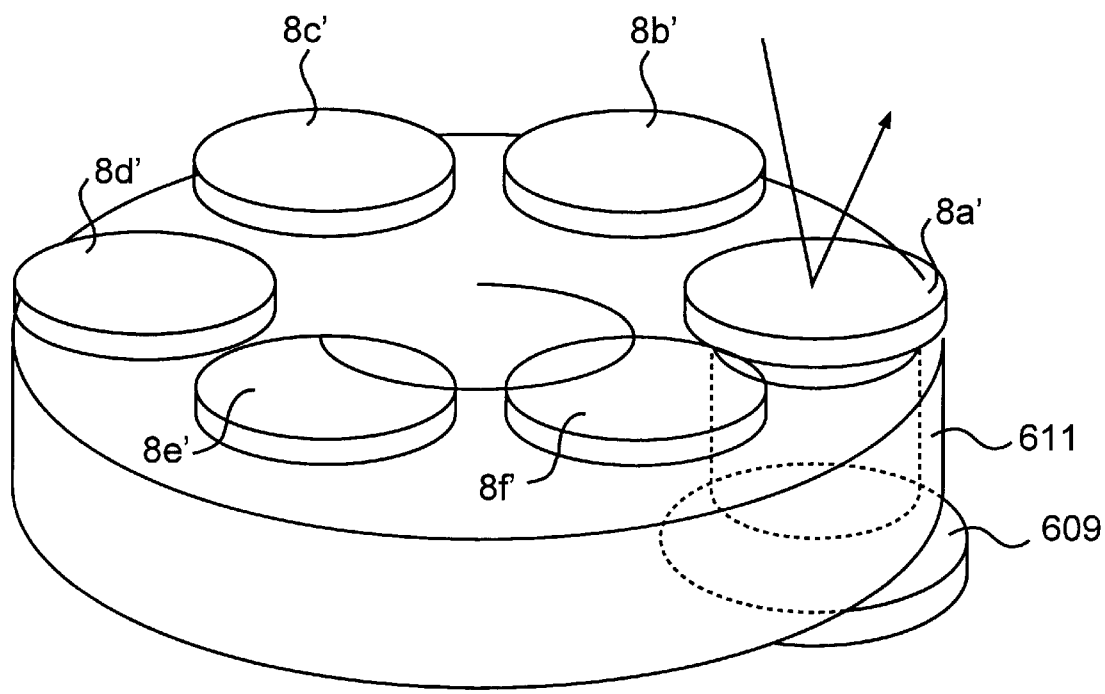
FIG. 21 shows the multiple film formation monitors and their shields in another thin-film-coated substrate manufacturing method embodiment pertaining to the present invention.

FIG. 20 shows an implementation mode involving multiple film formation monitoring plates (8a–8f in the diagram). A film formation monitor shield 610 is placed next to them on their film-forming particle generating source side, with a hole provided at a location that corresponds to 8a. A shutter is then located on the film-forming particle generating source side of 610. This represents a mechanism where multiple monitor plates are used in turn, from 8a to 8b, etc. The implementation mode shown in FIG. 21 is identical with the one in FIG. 20, except that the movement path of monitor plates is circular, instead of linear.

Figure 22:
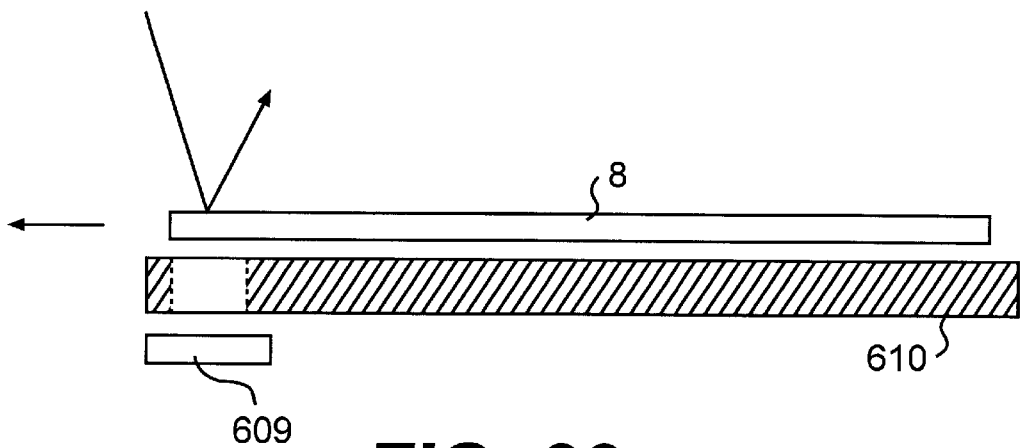
FIG. 22 shows the single film formation monitor with multiple monitoring portions in the thin-film-coated substrate manufacturing method pertaining to the present invention.
Figure 23:
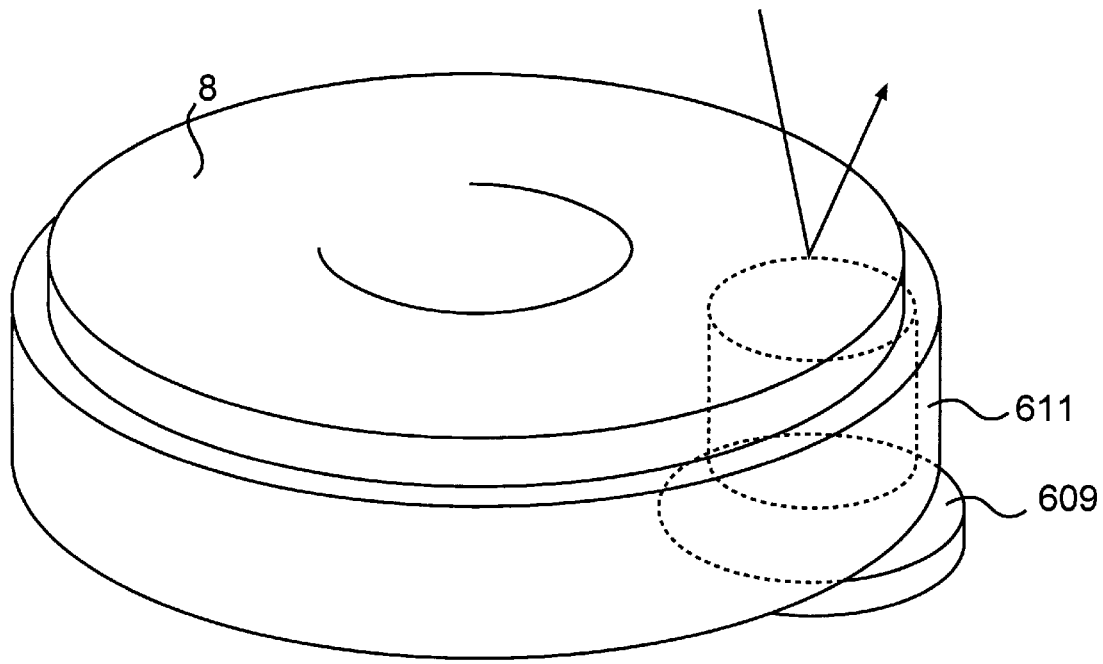
FIG. 23 shows the single film formation monitor with multiple monitoring portions in the thin-film-coated substrate manufacturing method pertaining to the present invention.

FIGS. 22 and 23 represent implementation modes where there is only a single film formation monitor and its film formation element can be replaced. These implementation modes are identical with those shown in FIG. 20 and 21, except that multiple monitoring plates have been replaced by multiple film formation elements on a single monitoring plate.

In the present invention, the film formation area limiting element means an element that is placed between the film-forming particle beam generating source and substrates to be coated with the function of limiting the area where the substrates to be coated are exposed to the film-forming particle beam by obstructing the traveling paths of some film-forming particles. As film formation area limiting elements, film formation corrector plates such as the one marked "4" in FIG. 2, which is a plate designed to limit the size or shape of the film formation area in the direction of the movement of the substrate to be coated, are used. (The reason why the film formation area 220 has a spool shape in FIG. 1 is because it is limited by semicircular corrector plates). Since film formation conditions comparable to those inside the film formation area can be obtained on the film-forming particle beam generating source side of the film formation area limiting element, it is preferable that the thickness of the monitor thin film be measured by placing the film formation monitor at this location, as this makes it easier to establish a consistent relationship between the thickness of the monitor thin film and that of the thin film formed on the substrates to be coated. The film formation area limiting element itself may be used as a film formation monitor, with the thickness of the thin film formed on it measured as a monitor thin film.

In the present invention, the thin film can be of any nature, but optical films to control the reflection or transmission characteristics of light, hard coats to increase the surface hardness of plastic substrates, insulating films, conductive films, etc. are preferable. Of these, optical films, which need precise thickness control, are particularly suitable for the present invention, and anti-reflection filters for display devices constitute the ideal application area, as they often involve large-size substrates to be coated.

In the present invention, preferred film thickness measurement methods include: optical interference or energy absorption applied to thin film formed on a film formation monitor placed inside the film-forming particle beam to measure its thickness; measurement of changes in the mechanical resonance frequency of the monitor plate; and measurement of electrical resistance if thin films have electrical conductivity. Where the thin film is an optical film, the optical interference method is preferable because of high measurement accuracy.

Measurement of thin film thickness based on optical interference consists of, for example, the radiation of light with a particular frequency on the monitor plate and measurement of the intensity of reflected or transmitted light. This takes advantage of the fact that the interference behavior of light varies with the refractive index and thickness of the thin film and that the reflectivity and transmittivity of light exhibit a periodic change during film formation. For example, film thickness is measured by detecting maximas and minimas in the intensity of reflected light. In this case, the measurement results reflect the effects of both film thickness and refractive index, but this is rather desirable with optical films, as the goal with such films is often bringing their optical path length, rather than thickness, in line with a specified value.

When using the optical interference method, it is preferable that the film coating process be controlled based on the fact that the intensity of interfering light changes in a periodic pattern due to interference. Namely, the intensity of the interfering light has a maximum when the optical path length of the thin film (which is proportional to the product of film thickness and refractive index) is an integer multiple of ¼ the wavelength of the measured light, so that if film formation is stopped when this condition is met, the optical path length of the thin film is guaranteed to be a multiple of ¼. This makes it possible to measure film thickness with a greater reproducibility than a control based on the absolute value of the intensity of interfering light.

When the light transmittivity of the thin film is low due to a large thickness of several micrometers or more, it is preferable that the method based on the measurement of changes in the mechanical resonance frequency of a quartz resonator be used.

In the present invention, it is preferable that vacuum evaporation, ion plating, sputtering, ablation, etc. be used as the film coating process based on the generation of a film-forming particle beam.

Vacuum evaporation is a thin film formation method involving, for example, the evaporation or sublimation of a thin-film material in a vacuum by heating and condensation and deposition of the vapor on a relatively cool substrate to be coated after transporting it there. The heating of the thin-film material is carried out by, for example, bombarding its surface with rays of charged particles such as electron beams. Ion plating is a type of vacuum evaporation involving, for example, a substrate to be coated placed in a glow discharge or some other plasma environment and provided with a bias potential. It aims to attract ionized particles generated in plasma to the substrate to be coated by placing an electrode at a location which is opposite to the film-forming particle beam generating source with respect to the substrate to be coated. Sputtering involves the bombardment of the surface of a thin-film material with beams of high energy particles, such as molecules and atoms, in a vacuum, and causes the film-forming particles of the thin-film material (atoms, molecules or their clusters) to be emitted into a vacuum by directly transferring this energy without resorting to heating. Ablation, on the other hand, carries out this energy supply by means of light.

These are all methods to emit thin-film material particles into a vacuum and generate a film-forming particle beam with a particular orientation (e.g. outward direction along the normal line to the film-forming particle beam generating surface), spreading outwards as the distance from the film-forming particle beam generating source increases. The line that represents the overall traveling direction of film-forming particles is called the film-forming particle beam axis. Generally, the concentration of film-forming particles is highest along the film-forming particle beam axis, and the larger the distance from this axis, the smaller the density will become. The kinetic energy held by film-forming particles also tends to decrease outside the vicinity of the axis.

The kinetic energy held by film-forming particles often has a great impact on the characteristics of the thin film formed on the substrates to be coated, such as refractive index. Generally, the greater the kinetic energy of film-forming particles, the more uniform the thin film will be and the greater the refractive index will be. Also, the more coincidental the inward direction along the normal line to the substrate surface, i.e. the opposite of the direction of the formation of the thin film on the substrate to be coated, and traveling direction of incoming film-forming particles, the higher the refractive index of the thin film formed will become. Therefore, the thin film formed around the center of the film formation area (in the vicinity of the film-forming particle beam axis) has high refractive index, and the refractive index decreases towards the outer edge of the film formation area. At the same time, film thickness will decrease as the quantity of film-forming particles decreases.

Methods to control the film coating process in the present invention include the following:

(1) Via the length of the area where the substrate to be coated or group of substrates to be coated is/are exposed to the film-forming particle beam; in the direction of their movement (2) Via the time taken by the substrate to be coated or group of substrates to be coated to pass through the area where the substrate to be coated or group of film coating target substrates is/are exposed to the film-forming particle beam;

(3) Via the quantity per unit time of film-forming particles that reach the area where the substrate to be coated or group of substrates to be coated is/are exposed to the film-forming particle beam; and (4) Via the surface temperature of the substrate to be coated or group of substrates to be coated.

Firstly, control of the film coating process using the method in (1) is explained. Basically, the thickness of the thin film formed on a substrate to be coated is proportional to the product of the quantity of film-forming particles reaching the surface of the substrate per unit time and the duration during which this surface stays within the film formation area. Therefore, the thickness of the thin film formed on the substrate to be coated can be controlled by adjusting the length of film formation area in the movement direction of the substrate to be coated.

However, since film formation takes place as the substrate to be coated is moved through the film formation area, with its various sections exposed to various parts of the film-forming particle beam. Film formation conditions inside the film-forming particle beam, such as the quantity of film-forming particles, vary from the vicinity of the film-forming particle beam axis to its outer edge region, as discussed above. Therefore, the thickness or physical characteristics of the same substrate to be coated vary from section to section depending on which part of the film-forming particle beam it is exposed to, even if the duration of exposure is the same length of time. As a result, it is generally desirable that the film formation area be given a spool shape, as in the case of the film formation area 20 in FIG. 1. For this reason, semicircular corrector plates are preferably placed in the traveling path of film-forming particles to shape the film formation area like a spool so that its edges perpendicular to the movement path of the substrates to be coated are curved in an arc. These corrector plates are produced based on the so-called cosine rule (a rule of thumb that states that film thickness changes proportionally with the third or fourth power of the cosine of the angle between the travel directions of individual film-forming particles and their overall traveling direction, i.e. along the film-forming particle beam axis), with adjustments, such as deciding on the final shape, made through repeated experiments, which are conducted until satisfactory film thickness and refractive index distributions are obtained. It is also a preferred practice to control the thickness of thin film by moving these corrector plates vertically or along the movement path of the substrate.

The film coating process control using the method in (2) will now be explained. In concrete terms, this means changing the movement speed of the substrates to be coated according to the thickness of the thin film formed on the film formation monitor. Similar to the method in (1), this controls the time length during which the surface of the substrate to be coated is exposed to the film-forming particle beam. Generally, the quantity of film-forming particles emitted by their source and the amount of their kinetic energy fluctuates with the conditions of the vacuum vessel, i.e. the degree of vacuum and cleanliness, and gas released from the substrate to be coated to be introduced. To achieve uniform film formation by compensating for the effects of these fluctuations, the movement speed of the substrates to be coated is changed as necessary, as the change in the thickness of the monitor thin film (i.e. film formation speed) is monitored. For example, controls such as increasing the movement speed when the film formation speed is large and decreasing it when it is small are preferably used.

Next the film coating process control using the method in (3) is explained. This involves adjusting the amount of energy put into the film-forming particle beam generating source according to the thickness of the film formed on the film formation monitor. This makes it possible to control the quantity of film-forming particles reaching the film formation area per unit time and their kinetic energy. For example, where energy is applied to the film-forming particle beam generating element of the thin-film material with an electron gun, the film coating process is controlled by lowering the filament current of the electron gun when the film formation speed is large and raising it when it is low. This method makes it possible to provide a feedback control for the process based on the measurement of the thickness of the monitor thin film.

Next the film coating process control using the method in (4) is explained. Where the quantity of film-forming particles reaching the film formation area is fixed, the film formation speed is high and the thin film produced has a high refractive index, if the surface temperature of the substrate to be coated is high. Taking advantage of this relationship, control can be provided for the film formation process involving the film formation speed and refractive index, based on the surface temperature of the substrate to be coated.

Also, it is preferable that the film coating process be controlled based on the film formation speed as obtained from the measurement of the thickness of the thin film formed on the film formation monitor. As far as the inventors know, the film formation speed quite often has a correlation with the physical properties of the thin film being produced. For example, $TiO_2$ film production takes place as follows: $TiO_2$ at the film-forming particle beam source becomes $Ti_3O_5$ in a molten state and gets emitted into vacuum; $Ti_3O_5$ becomes $TiO_2$ again through oxidation/reduction reaction with $O_2$, either in transit or on the substrate, and deposits as $TiO_2$ film. This oxidation/reduction reaction is greatly influenced by kinetic energy held by $Ti_3O_5$ particles. The kinetic energy of film-forming particles is a physical quantity with a one-to-one relationship with their traveling speed, and has a strong correlation with film formation speed. The inventors of the present invention discovered that thin films that have desirable physical characteristics can be produced by controlling film formation speed. For example, it is possible in some cases to produce high refractive index films with no absorption at particular film formation speeds. It is also possible in some cases to periodically change the physical characteristics of the thin film by changing the film formation speed periodically. Preferably ITO (indium-tin oxides), which have recently been applied to LCD etc., $SnO_2$, $In_2O_3$ and the like are used as thin-film materials that allow the control of physical characteristics via film formation speed.

Although further explanation will be given by way of working examples, the present invention is not limited to the implementation modes shown therein.

The case of using a fixed film formation monitor is first described.

EXAMPLE 1

Thin-film-coated substrates were manufactured by producing a thin film on a group of substrates to be coated, while measuring the thickness of the monitor thin film by placing a film formation monitoring plate at the location shown in FIG. 1. The thin-film-coated substrates are to be used as anti-reflection filters for display devices, and the thin film, as an optical film, requires rigorous thickness control.

The film coating process is vacuum evaporation and transparent plastic was used as the material of the substrates to be coated. The width of the film formation area was set at 1 m.

The distance between the film formation monitoring plate and the film-forming particle beam generating source was set between the minimum and maximum of the distance from said generating source and the film formation area. The inward direction along the normal line to the film formation monitoring plate and the travailing direction of film-forming particles at the monitoring plate were set to coincide with each other. The thickness of the monitor thin film formed on the film formation monitoring plate was measured using the optical interference method.

The relationship between the thickness of the thin film formed on the substrate to be coated, $t_1$, and that of the monitor thin film at the completion of film formation, $t_m$, is expressed as follows:

$$t_m = 0.8 \times t_1 \times n,$$

where n is the number of substrate groups that pass through the film formation area, and film production was carried out using this relationship. Placing the film formation monitoring plate at this location made it possible to produce a monitor thin film under desirable conditions, similar to those of the thin film formed on the substrates to be coated.

Film production was possible with each of the following substrate group configurations:

(1) Three substrates to be coated measuring 260×330 mm placed in a row;
(2) Three substrates to be coated measuring 310×380 mm placed in a row;
(3) Two substrates to be coated measuring 380×450 mm placed in a row; and
(4) One substrate to be coated measuring 400×950 mm. It was also easy to switch to other configurations.

Comparative Example 1

Figure 7:
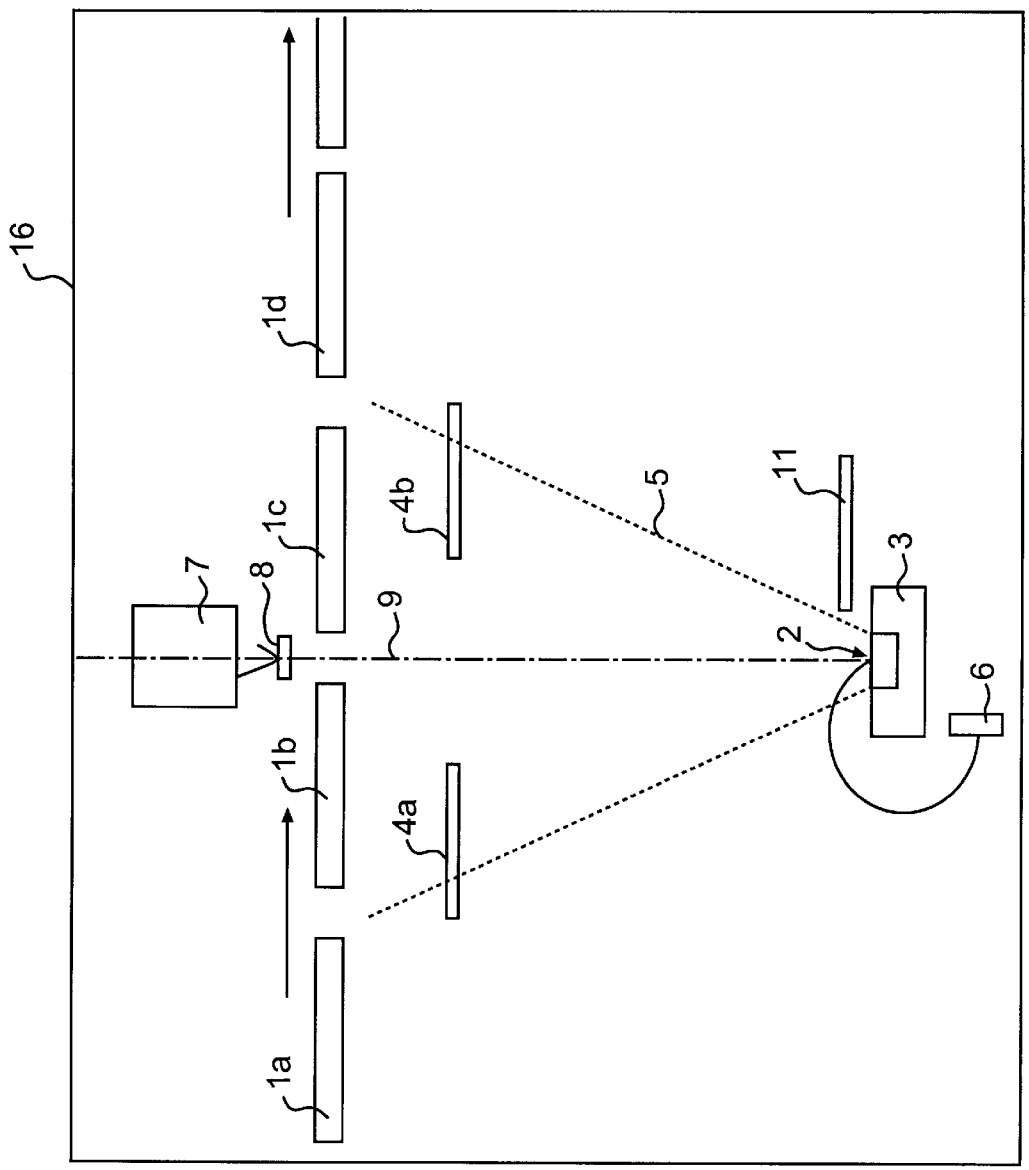
FIG. 7 shows a conventional thin-film-coated substrate manufacturing method.

This is identical with working example 1 except that the film formation monitoring plate was placed at the location shown in FIG. 7 and 8, and thin-film-coated substrates were manufactured by producing a thin film on a group of substrates to be coated, while measuring the thickness of the monitor thin film.

The relationship between the thickness of the thin film formed on the substrate to be coated, $t_1$, and that of the monitor thin film at the completion of film formation, $t_m$, is expressed as follows:

$$t_m = 0.4 \times t_1 \times n,$$

where n is the number of substrate groups that pass through the film formation area, and film production was carried out using this relationship. Since the film formation monitoring plate was placed at this location, the quantity of film-forming particles reaching the film formation monitor was reduced for reasons such as blockage by the substrates to be coated. This film formation condition cannot be regarded as comparable to that of the thin film formed on the substrates to be coated.

Film production was impossible except for the following substrate group configurations due to constraints associated with the location of the film formation monitoring plate:

(1) Two substrates to be coated measuring 260×330 mm placed in a row;
(2) One each of substrates to be coated measuring 260× 330 mm and 310×380 mm placed in a row;
(3) One each of substrates to be coated measuring 260× 330 mm and 380×450 mm placed in a row.

As a result, productivity fell to ⅔ that of the working example 1 when manufacturing thin-film-coated substrates measuring 260×330 mm. With 310×380 mm or 380×450 mm thin-film-coated substrates, it was necessary to combine them with 260 ×330 mm ones. When manufactured alone, these gave only ⅓ and ½ the productivity of the working example 1, respectively.

EXAMPLE 2

Thin-film-coated substrates were manufactured by producing a thin film on tape-like substrates to be coated, while measuring the thickness of the monitor thin film by placing a film formation monitoring plate at the location shown in FIG. 3. The thin-film-coated substrates are to be used as anti-reflection filters for display devices, and the thin film, as an optical film, requires rigorous thickness control.

The film coating process is vacuum evaporation and a transparent plastic film was used as the material of the substrates to be coated. The width of the film formation area was set at 1 m.

The distance between the film formation monitoring plate and the film-forming particle beam generating source was set at 0.9 times the minimum of the distance from said generating source and the film formation area. The inward direction along the normal line to the film formation monitoring plate and the travailing direction of film-forming particles at the monitoring plate were set to coincide with each other. The thickness of the monitor thin film formed on the film formation monitoring plate was measured using the optical interference method.

The relationship between the thickness of the thin film formed on the substrate to be coated, $t_1$, and that of the monitor thin film at the completion of film formation, $t_m$, is expressed as follows:

$$t_m = 1.1 \times t_1 \times n,$$

where n is the total film production time divided by the time in which the center of the substrate passes through the film formation area.

The width of the substrate to be coated was set to 900 mm. The tape width can be anything up to 950 mm, and where it was 450 mm or less, it was possible to place two side by side to form a group of substrates to be coated.

Next the case of the film formation monitor being mobile is explained.

EXAMPLE 3

Thin-film-coated substrates were manufactured by producing a thin film on a group of substrates to be coated of varying sizes, while measuring the thickness of the monitor thin film formed on a film formation monitor which was made mobile within the film-forming particle beam as shown in FIG. 10 and 11. The thin-film-coated substrates are used as anti-reflection filters for display devices, and the thin film, as an optical film, requires rigorous thickness control.

The film coating process is vacuum evaporation and transparent plastic was used as the material of the substrates to be coated. The width of the film formation area was set at 1 m.

The range of the distance between the film formation monitoring plate and the film-forming particle beam generating source was set between the minimum and maximum of the distance from said generating source and the film formation area. The inward direction along the normal line to the film formation monitoring plate and the travailing direction of film-forming particles at the monitoring plate were set to coincide with each other. The thickness of the monitor thin film formed on the film formation monitoring plate was measured using the optical interference method.

Thin films were produced on substrates to be coated for the following four configurations.

(1) Thin-film-coated substrates were manufactured on 310×380 mm substrates to be coated arranged in two rows as shown in FIG. 12. Film thickness measurement was carried out by moving the film formation monitor to the location shown as "Y" in the drawing.

When the film formation monitor is at "Y", the relationship between the thickness of the thin film formed on the substrates to be coated, $t_1$, and that of the monitor thin film at the completion of film formation, $t_m$, is as follows:

$$t_m = 0.4 \times t_1 \times n,$$

where n is the number of substrate groups. Film production was carried out using this relationship. Moving the film formation monitoring plate to this location made it possible to control the film coating process based on the results of monitor film thickness measurement.

(2) Thin-film-coated substrates were manufactured using 260×330 mm and 310×380 mm substrates to be coated arranged in one column each. Film thickness measurement was carried out with the film formation monitor moved to the location shown as "X" in FIG. 13.

When the film formation monitor is at "X", the relationship between the thickness of the thin film formed on the substrates to be coated, $t_1$, and that of the monitor thin film at the completion of film formation, $t_m$, is as follows:

$$t_m 32\ 0.35 \times t_1 \times n,$$

where n is the number of substrate groups. Film production was carried out using this relationship. Moving the film formation monitoring plate to this location made it possible to control the film coating process based on the results of monitor film thickness measurement.

(3) Thin-film-coated substrates were manufactured on 200 ×330 mm substrates to be coated arranged in three rows as shown in FIG. 14. Film thickness measurement was carried out by moving the film formation monitor to the location shown as "Z" in the drawing.

When the film formation monitor is at "Z", the relationship between the thickness of the thin film formed on the substrates to be coated, $t_1$, and that of the monitor thin film at the completion of film formation, $t_m$, is as follows:

$$t_m = 0.32 \times t_m \times n,$$

where n is the number of substrate groups. Film production was carried out using this relationship. Providing the film formation monitoring plate at this location made it possible to control the film coating process based on the results of monitor film thickness measurement.

(4) Thin-film-coated substrates were manufactured on 400 ×900 mm substrates to be coated arranged in a row as shown in FIG. 15. Film thickness measurement was carried out by moving the film formation monitor to the location shown as "W" in the drawing.

When the film formation monitor is at "W", the relationship between the thickness of the thin film formed on the substrates to be coated, $t_1$, and that of the monitor thin film at the completion of film formation, $t_m$, is as follows:

$$t_m 0.8 \times t_1 \times n,$$

where n is the number of substrate groups. Film production was carried out using this relationship. Placing the film formation monitoring plate at this location made it possible to produce a monitor thin film under desirable conditions, which are similar to those of the thin film formed on the substrates to be coated.

Industrial Field of Application

This invention relates to manufacturing methods and apparatus for thin-film-coated substrates involving optical coatings for optical filters, such as anti-reflection filters, interference filters, half mirrors and band-pass filters; anti-reflection coatings for various display devices; and other thin film products used for semiconductors, optical disks, etc.

With the thin-film-coated substrate manufacturing method and apparatus pertaining to the present invention, it is possible to manufacture thin films and thin-film-coated substrates using small-scale manufacturing apparatus, even in the case of producing thin films on large substrates to be coated.

With the thin-film-coated substrate manufacturing method and apparatus pertaining to the present invention, it is possible to increase the productivity of thin-film-coated substrate manufacturing processes by increasing the flexibility in the arrangement of substrates to be coated, even in the case of producing thin films on large substrates to be coated.

With the thin-film-coated substrate manufacturing method and apparatus pertaining to the present invention, it is possible to manufacture thin films and thin-film-coated substrates using small-scale manufacturing apparatus, even in the case of producing thin films on large tape-like substrates to be coated.

With the thin-film-coated substrate manufacturing method and apparatus pertaining to the present invention, it is possible to control film thickness accurately by producing monitor thin films with characteristics similar to those of thin films formed on substrates to be coated.

With the thin-film-coated substrate manufacturing method and apparatus pertaining to the present invention, it is possible to control the physical characteristics of thin films accurately through the control of the film coating process based on the formation speed of the monitor thin film formed on the film formation monitor.

With the thin-film-coated substrate manufacturing method and apparatus pertaining to the present invention, it is possible to achieve stable precision control of ultra thin films, even when the substrates to be coated are tape-like continuous materials.

We claim:

1. A thin-film-coated substrate manufacturing method that exposes at least one substrate to be coated during movement thereof through a film-forming particle beam, comprising steps of:

providing at least one film-forming particle beam generating source for generating a film within a film-forming particle exposure area, said beam including a central axis;

moving the at least one substrate to be coated with a moving device along a pathway into the exposure area, said exposure area including a film formation area, said film formation area including a surface of the at least one substrate and a surface of said moving device;

providing at least one optical interference film formation monitor plate within the exposure area;

generating film-forming particles from the at least one generating source into the film-forming particle exposure area to form a monitoring film on the at least one film formation monitor plate and for coating a thin film on the at least one substrate;

continuously measuring a thickness and a refractive index of the monitoring film formed on the at least one film formation monitor plate by using an optical interference measuring device; and coating the thin film on the at least one substrate, the step of coating including a step of continuously monitoring the thickness of the monitoring film and coating the thin film in accordance with the thickness and the refractive index of the monitoring film, wherein the at least one film formation monitor plate is either (i) affixed within the exposure area and outside the film formation area and outside said central axis of said beam; or (ii) displaceable within the exposure area and within said central axis of said beam, whereby a correlation of the film thickness disposed on the at least one affixed or displaceable monitoring plate relative to a film thickness disposed on the at least one substrate is substantially maximized, wherein a distance from the at least one film formation monitor plate to one generating source is in a range of 0.9 times or more of a minimum distance from the one generating source to the closest point thereto in the film formation area and in a range of 1.1 times or less of a maximum distance from the one generating source to the farthest point therefrom in the film formation area; or a first angle formed by a straight line connecting a location of the at least one film formation monitor plate and the at least one generating source and a film-forming particle beam axis is in a range of twice or less than a second angle formed by a straight line connecting the at least one generating source and the farthest point therefrom in the film formation area and the film-forming particle beam axis thereof.

2. The thin-film-coated substrate manufacturing method according to claim 1, further comprising the step of providing the at least one generating source includes limiting the exposure area by interposing a film formation area limiting element between the at least one generating source and the at least one substrate.

3. The thin-film-coated substrate manufacturing method according to claim 1, wherein the at least one substrate is a row of substrates.

4. The thin-film-coated substrate manufacturing method according to claim 1, wherein the at least one substrate is multiple rows of substrates.

5. The thin-film-coated substrate manufacturing method as claimed in claim 1, wherein a shorter side of said at least one substrate is 20 cm or more.

6. The thin-film-coated substrate manufacturing method according to claim 1, wherein the at least one substrate is unwound from a substrate roll.

7. The thin-film-coated substrate manufacturing method according to claim 6, wherein a width of the at least one substrate is 20 cm or more.

8. The thin-film-coated substrate manufacturing method according to claim 1, wherein an angle formed by a straight line connecting a location of any of the at least one film formation monitor plate and any of the at least one generating source and a normal line to a monitoring film formation surface on any of the at least one film formation monitor is in a range of 400 or less.

9. The thin-film-coated substrate manufacturing method according to claim 1, wherein said at least one film formation monitor plate is one of a plurality of film formation monitor plates and the step of monitoring includes monitoring one of said plurality of film formation monitor plates until a first thickness is detected and then monitoring another of said plurality of film formation monitor plates until a second thickness is detected.

10. The thin-film-coated substrate manufacturing method according to claim 1, wherein said step of coating includes adjusting a length of the film formation area in the pathway of said at least one substrate.

11. The thin-film-coated substrate manufacturing method according to claim 1, wherein said step of coating includes controlling a passing through speed of said at least one substrate inside the film formation area.

12. The thin-film-coated substrate manufacturing method according to claim 1, wherein said step of coating includes controlling a quantity of film-forming particles reaching the film formation area per unit time.

13. The thin-film-coated substrate manufacturing method according to claim 1, wherein said step of coating includes controlling according to a surface temperature of said at least one substrate.

14. The thin-film-coated substrate manufacturing method according to claim 1, wherein said step of coating includes controlling a film formation speed based on the thickness of the monitoring film measured.

15. The thin-film-coated substrate manufacturing method according to claim 14, wherein said step of coating includes maintaining said film formation speed substantially constant.

16. The thin-film-coated substrate manufacturing method according to claim 1, wherein said step of generating the film-forming particles is at least one of vacuum evaporation, ion plating, sputtering or ablation.

17. The manufacturing method according to claim 1, wherein the at least one film formation monitor plate is affixed within the exposure and adjacent to the film formation area.

18. The manufacturing method according to claim 1, wherein the at least one film formation monitor plate is displaceable within the exposure area.

19. The manufacturing method according to claim 2, wherein the film formation area has a shape defined by four sides, where one pair of sides is substantially linear while another pair of sides is substantially concavely curved.

20. A thin-film-coated substrate manufacturing system comprising:

at least one film-forming particle beam generating source;

means for moving at least one substrate to be coated along a pathway through an exposure area including a film formation area, said film formation area including a surface of the at least one substrate and a surface of said moving means, said exposure area being exposed to a film-forming particle beam generated by the at least one film-forming particle beam generating source, said beam including a central axis;

at least one optical interference film measuring device, said at least one film-forming particle beam generating source being controlled in accordance with data from said at least one optical interference film measuring device; and at least one optical interference film formation monitor plate, said measuring device measures light intensity and color of light reflected from said monitor plate, the at least one film formation monitor plate is either
  (i) affixed within the exposure area and outside the film formation area and outside said central axis of said beam; or
  (ii) displaceable within the exposure area and within said central axis of said beam, whereby a correlation of the film thickness disposed on the at least one affixed or displaceable monitoring plate relative to a film thickness disposed on the at least one substrate is substantially maximized, wherein a distance from the at least one optical interference monitor plate the at least one generating source is in a range of 0.9 times or more of a first distance from the at least one generating source to the closest point thereto in the film formation area and 1.1 times or less of a second distance from the at least one generating source to the farthest point therefrom in the film formation area; or a first angle formed by a straight line connecting a location of the at least one film formation monitor plate and the at least one generating source and a film-forming particle beam axis is in a range of twice or less than a second angle formed by a straight line connecting the at least one generating source and the farthest point therefrom in the film formation area and the film-forming particle beam axis thereof.

21. The thin-film-coated substrate manufacturing system according to claim 20, wherein said at least one substrate is a plurality of substrates.

22. The thin-film-coated substrate manufacturing system according to claim 20, wherein the means for moving at least one substrate includes substrate rolls.

23. The thin-film-coated substrate manufacturing system according to claim 20, wherein the angle formed by a straight line connecting a location of any of the at least one film formation monitor plate and any of the at least one generating source and a normal line to a monitoring film formation surface on any of the at least one film formation monitor plate is in a range of 40° or less.

24. The thin-film-coated substrate manufacturing system according to in claim 20, wherein said at least one film formation monitor plate is one of a plurality of film formation monitor plates and further comprising means for producing thin films by controlling film coating based on a thickness of monitoring films formed on said plurality of film formation monitor plates.

25. The thin-film-coated substrate manufacturing system according to claim 20, which further comprises means for controlling film coating by adjusting a length of the exposure area along the pathway in a movement direction of said at least one substrate.

26. The thin-film-coated substrate manufacturing system according to claim 20, further comprises means for controlling a speed of movement of said at least one substrate in the exposure area.

27. The thin-film-coated substrate manufacturing system according to claim 20, which further comprises means for controlling a quantity of film-forming particles reaching the exposure area per unit time.

28. The manufacturing apparatus according to claim 20, wherein the at least one film formation monitor plate is affixed within the exposure and adjacent to the firm formation area.

29. The manufacturing apparatus according to claim 20, wherein the at least one film formation monitor plate is displaceable within the exposure area.

* * * * *